(12) United States Patent
Farabegoli et al.

(10) Patent No.: US 8,264,389 B2
(45) Date of Patent: Sep. 11, 2012

(54) SUCCESSIVE APPROXIMATION ANALOG-TO-DIGITAL CONVERTER

(75) Inventors: Gianluca Farabegoli, Cesena (IT);
Mauro Giacomini, Bergamo (IT);
Marco Losi, Bollate (IT)

(73) Assignee: STMicroelectronics S.r.L., Agrate Brianza (IT)

( * ) Notice: Subject to any disclaimer, the term of this patent is extended or adjusted under 35 U.S.C. 154(b) by 136 days.

(21) Appl. No.: 12/859,007

(22) Filed: Aug. 18, 2010

(65) Prior Publication Data

US 2011/0043394 A1 Feb. 24, 2011

(30) Foreign Application Priority Data

Aug. 18, 2009 (IT) .............................. MI2009A1489

(51) Int. Cl.
*H03M 1/10* (2006.01)

(52) U.S. Cl. ......... 341/120; 341/118; 341/155; 341/163

(58) Field of Classification Search ............... 341/155, 341/156, 163, 118, 120, 119, 117
See application file for complete search history.

(56) References Cited

U.S. PATENT DOCUMENTS

| | | | |
|---|---|---|---|
| 6,674,386 B2 * | 1/2004 | Carreau et al. | 341/155 |
| 7,038,609 B1 * | 5/2006 | Hurrell | 341/156 |
| 7,158,070 B1 * | 1/2007 | Yang et al. | 341/163 |
| 7,161,512 B1 * | 1/2007 | Keskin | 341/118 |
| 2008/0158028 A1 | 7/2008 | Yang et al. | |
| 2008/0198056 A1 * | 8/2008 | Hurrell | 341/155 |
| 2009/0109079 A1 * | 4/2009 | Ahmad | 341/156 |

* cited by examiner

*Primary Examiner* — Jean B Jeanglaude
(74) *Attorney, Agent, or Firm* — Seed IP Law Group PLLC

(57) ABSTRACT

An analog-to-digital converter has a self-test capability that provides not only an indication of failure or performance degradation but also identifies the failed or degraded component or components. The converter includes a first generator configured to generate a first analog value, a digital-to-analog converter configured to generate a second analog value, a second generator configured to generate a digital value from the comparison of the first analog value with respect to the second analog value, a controller configured to receive a signal indicating a test mode and to generate a configuration signal to the first generator, to receive the digital value and generate a control signal to control the generation of the second analog value, and to generate from the digital value an alarm signal indicating a failure within the analog-to-digital converter or indicating a degradation of the performance of the analog-to-digital converter.

20 Claims, 7 Drawing Sheets

SUCCESSIVE APPROXIMATION ANALOG-TO-DIGITAL CONVERTER

BACKGROUND

1. Technical Field

The present disclosure generally relates to the field of analog-to-digital converters and, more particularly, to a successive-approximation analog-to-digital converter.

2. Description of the Related Art

It is known that an analog-to-digital converter is a device for converting an analog signal into a digital signal represented by a determined number of bits. Specifically, it is known the successive-approximation analog-to-digital converter, wherein the bits of the digital signal are successively determined one by one, typically from the most significant bit to the least significant bit.

Failures or performance degradation of the components of the analog-to-digital converter can occur. A successive-approximation analog-to-digital converter generally includes a first plurality of capacitors to convert a digital signal into an analog signal and a second plurality of capacitors to perform a self-calibration for compensating variations of capacitance values of the first plurality of capacitors, thus improving the accuracy of the analog-to-digital converter.

There are known techniques for performing the test of the operation of the analog-to-digital converter by using circuits outside the analog-to-digital converter, which thus have the disadvantage of requiring a dedicated circuit for performing the test.

Therefore it is necessary to guarantee a correct operation of the analog-to-digital converter, especially in applications that require high safety and reliability, such as for example in the automotive field.

BRIEF SUMMARY

The present disclosure relates to an analog-to-digital converter in preferred embodiments thereof described herein. More particularly, the successive-approximation analog-to-digital converter according to the present disclosure can be used itself for performing a test for controlling its correct operation. This has the advantage of not requiring additional circuits external to the analog-to-digital converter and of not requiring complex modifications to the same analog-to-digital converter. Moreover, the analog-to-digital converter according to an aspect of the disclosure has the advantage of providing not only an indication of a failure or degradation of the operation of the analog-to-digital converter (for example, of a component of the converter), but also of providing the position of the failure or degradation within the analog-to-digital converter (that is which is the failed or degraded component).

In accordance with the present disclosure, an analog-to-digital converter is provided that includes a first generator that generates a first analog value according to a configuration signal when the analog-to-digital converter is operating in a first phase of a test mode; a digital-to-analog converter adapted to generate a second analog value according to a control signal when the analog-to-digital converter is operating in a second phase of the test mode; a second generator that generates a digital value from the comparison of the first analog value with respect to the second analog value according to a successive-approximation algorithm when the analog-to-digital converter is operating in the second phase of the test mode; a controller adapted to receive a signal indicating the test mode, and adapted to: generate in the first phase the configuration signal, receive in the second phase the digital value and generate therefrom the control signal for controlling the generation of the second analog value according to the successive-approximation algorithm, and generate, from the digital value, an alarm signal indicating a failure within the analog-to-digital converter or indicating a degradation of the performance of the analog-to-digital converter.

In accordance with another aspect of the present disclosure, an integrated circuit is provided that includes the analog-to-digital converter described above.

In accordance with a further aspect of the present disclosure, an electronic system is provided that includes an analog-to-digital converter having a first generator that generates a first analog value according to a configuration signal when the analog-to-digital converter is operating in a first phase of a test mode; a digital-to-analog converter adapted to generate a second analog value according to a control signal when the analog-to-digital converter is operating in a second phase of the test mode; a second generator that generates a digital value from the comparison of the first analog value with respect to the second analog value according to a successive-approximation algorithm when the analog-to-digital converter is operating in the second phase of the test mode; a controller adapted to receive a signal indicating the test mode, and adapted to generate in the first phase the configuration signal, receive in the second phase the digital value and generate therefrom the control signal for controlling the generation of the second analog value according to the successive-approximation algorithm; generate, from the digital value, an alarm signal indicating a failure within the analog-to-digital converter or indicating a degradation of the performance of the analog-to-digital converter; and a micro-processor adapted to compare the digital value with respect to a range of values and to generate therefrom the alarm signal indicating the failure or the degradation, in case the digital value is out of the range.

In accordance with still yet a further aspect of the present disclosure, a method for testing the operation of an analog-to-digital converter is provided, the method having a first phase and a second phase. The first phase includes the steps of: (a) receiving a signal indicating a test mode operation; (b) generating a configuration signal; (c) generating a first analog value according to the configuration signal; the second phase including the steps of: (d) generating a control signal; (e) generating a second analog value according to the control signal; (f) comparing the first analog value with respect to the second analog value and generating therefrom a digital value according to a successive-approximation algorithm; (g) receiving the digital value and generating therefrom the control signal for controlling the generation of the second analog value according to the successive-approximation algorithm; (h) generating, from the digital value, an alarm signal indicating a failure within the analog-to-digital converter or indicating a degradation of the performance of the analog-to-digital converter.

BRIEF DESCRIPTION OF THE SEVERAL VIEWS OF THE DRAWINGS

Further features and the advantages of the disclosure will be understood from the following description of a preferred embodiment and of its variations given in an illustrative way referring to the enclosed drawings, wherein.

DETAILED DESCRIPTION

Figure 1:
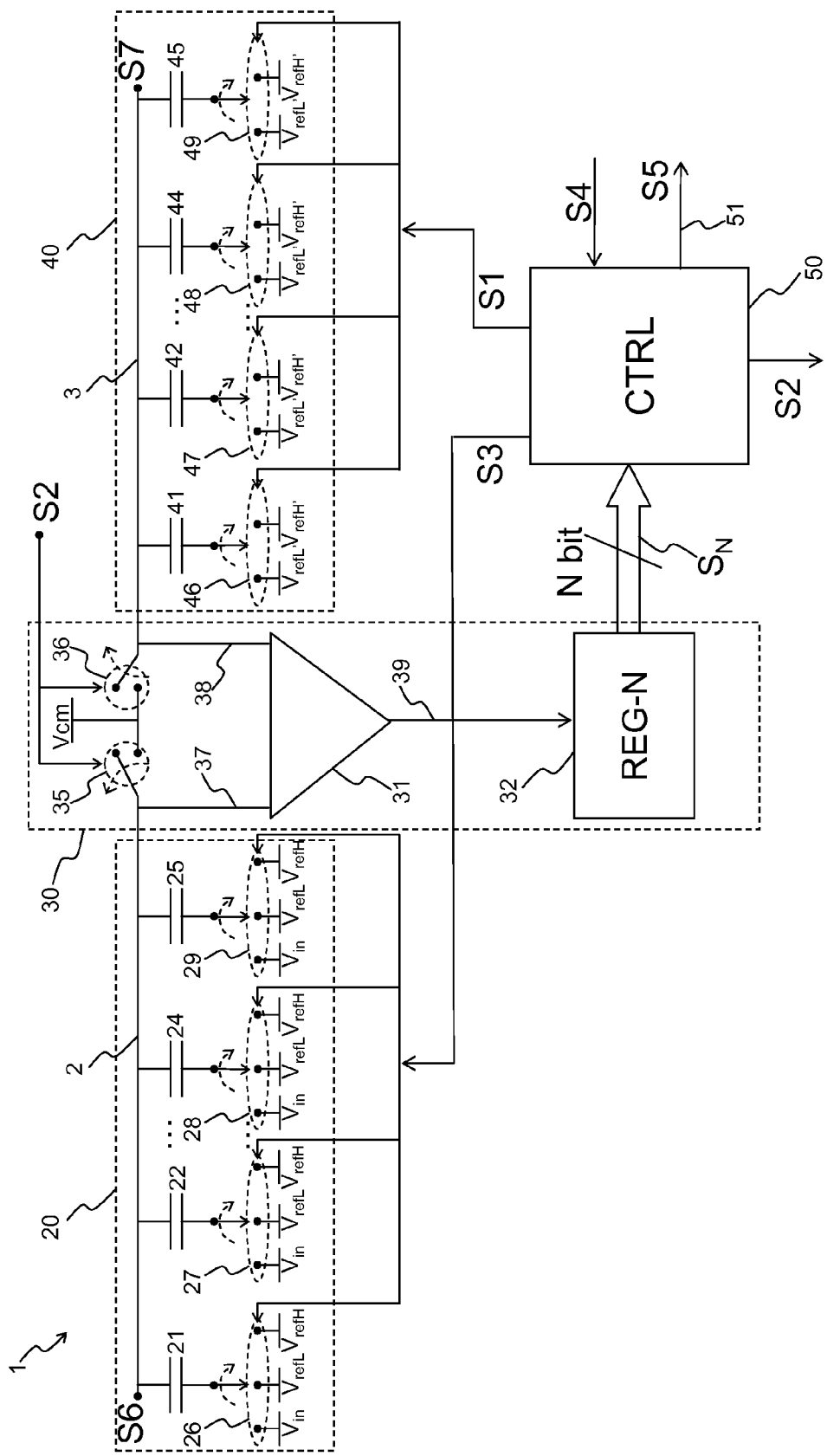
FIG. 1 schematically shows an analog-to-digital converter according to a first embodiment of the disclosure.

With reference to FIG. 1, an analog-to-digital converter is shown according to a first embodiment of the disclosure.

The analog-to-digital converter 1 has a normal operation mode wherein it performs the conversion of an input analog value $V_{in}$ (for example, an analog voltage value) into an output digital value $S_N$ quantitated with N bit; the normal operation mode includes a sampling phase and a subsequent conversion phase.

The analog-to-digital converter 1 further has a test operation mode wherein it performs a test of the operation of the analog-to-digital converter 1 itself. The test operation mode includes a configuration phase and a subsequent phase of execution of the successive-approximation algorithm, as will be described in more detail afterwards in the section relating to the operation of the analog-to-digital converter 1. For example, the test operation mode can be activated when the analog-to-digital converter 1 is inactive, that is when the analog-to-digital converter 1 is not performing a conversion from analog to digital in the normal operation mode.

The analog-to-digital converter 1 includes:

a first generator 20 having an output terminal 2 and having the function of performing the sampling of the input analog value $V_{in}$ when the analog-to-digital converter 1 operates in the sampling phase of the normal operation mode, and having the function of performing the conversion from the digital value $S_N$ into an analog value when the analog-to-digital converter 1 operates in the conversion phase of the normal operation mode. Moreover, the first generator 20 is structured to generate at the output terminal 2 a first analog value (in the following referred to with $V_x$) as a function of a configuration signal S3, when the analog-to-digital converter 1 is configured to operate in the configuration phase of the test operation mode, as it will be explained more in detail afterwards in the section relating to the operation of the analog-to-digital converter 1;

a digital-to-analog converter 40 having an output terminal 3 for generating an analog value when the analog-to-digital converter 1 operates in normal operation mode. Moreover, the digital-to-analog converter 40 is structured to generate at the output terminal 3 a second analog value as a function of a control signal S1 when the analog-to-digital converter 1 is configured to operate in the phase of execution of the successive-approximation algorithm of the test operation mode, as it will be explained more in detail in the following with reference to the description of the analog-to-digital converter 1 in the test mode. The digital-to-analog converter 40 is used to perform the test of the operation of components inside the analog-to-digital converter 1 (as it will be described more in detail in the following), by means of the execution of a successive-approximation algorithm on the digital-to-analog converter 40;

a second generator 30 that receives an analog value from the output terminal 2, an analog value from the output terminal 3, and generates a digital value $S_N$ through a successive-approximation algorithm, when the analog-to-digital converter 1 is configured to operate in the conversion phase of the normal operation mode. Moreover, the second generator 30 is structured to receive the first analog value $V_x$ from the output terminal 2 of the first generator 20, is structured to receive the second analog value from the output terminal 3 of the digital-to-analog converter 40, and it is structured to perform a comparison between the first analog value $V_x$ and the second analog value. It is further structured to generate the digital value $S_N$ corresponding to the digital conversion of the first analog value $V_x$ by means of a successive-approximation algorithm when analog-to-digital converter 1 is configured to operate in the execution phase of the successive-approximation algorithm of the test operation mode, as it will explained more in detail hereinafter; and a controller 50 for receiving a mode selection signal S4 indicating the normal operation or test operation mode of the analog-to-digital converter 1 and for receiving the digital value $S_N$ from the second generator 30; moreover, the controller 50 generates the control signal S1 and provides it to the digital-to-analog converter 40 when the analog-to-digital converter 1 is configured to operate in the conversion phase of the normal operation mode and in the phase of execution of the successive-approximation algorithm of the test mode. The controller 50 is also structured to generate the configuration signal S3 and provide it to the first generator 20 when the analog-to-digital converter 1 is configured to operate in the sampling phase of the normal operation mode and in the configuration phase of the test mode, as it will be explained more in detail hereinafter.

It should be noted that the normal or test operation mode can be used in the same way with the analog-to-digital converter 1 or to the controller 50; therefore, it will be indicated as the normal or the test operation mode of the analog-to-digital converter 1 or of the controller 50.

Preferably, the first generator 20 of the first embodiment of the disclosure is implemented with a plurality of capacitors—indicated in the following with sampling capacitors—21, 22, . . . 24, 25 having equal capacitance values of the capacitors and having respective first terminals connected to each other in order to form a common terminal that coincides (see FIG. 1) with the output terminal 2 of the first generator 20 (this common terminal will be indicated in the following with "common terminal 2"). The first generator 20 further includes a plurality of switches 26, 27, . . . 28, 29 adapted to switch, as a function of the configuration signal S3, among a first, a second, and a third position for connecting the second terminals (that is the terminals different from the first terminals connected to each other to form the common terminal 2) of the plurality of sampling capacitors 21, 22, . . . 24, 25 to the input analog value $V_{in}$, or to a low reference voltage VrefL, or to a high reference voltage VrefH (higher than the low reference voltage VrefL), respectively. The plurality of sampling capacitors 21, 22, . . . 24, 25 and the plurality of switches 26, 27, . . . 28, 29 controlled by the configuration signal S3 have the function of generating at the output terminal 2 the first analog value $V_x$ at the end of the configuration phase of the test operation mode. The plurality of sampling capacitors 21, 22, . . . 24, 25 and the plurality of switches 26, 27, . . . 28, 29 controlled by the configuration signal S3 also have the function of performing a digital-to-analog conversion of the digital value $S_N$ (corresponding to the sampled input analog value $V_{in}$) when the analog-to-digital converter 1 operates during the conversion phase of the normal operation mode: therefore, in the conversion phase of the normal operation mode the plurality of sampling capacitors 21, 22, ... 24, 25 and the plurality of switches 26, 27, ... 28, 29 controlled by the configuration signal S3 are such to operate as a capacitive-type digital-to-analog converter for converting the digital value $S_N$ into an analog value.

Preferably, the digital-to-analog converter 40 of the first embodiment of the disclosure is of a capacitive type, that is it is implemented with a plurality of capacitors—indicated in the following with reference capacitors—41, 42, ... 44, 45 having equal capacitance values and having respective first terminals connected to each other in order to form a common terminal that coincides (see FIG. 1) with the output terminal 3 of the digital-to-analog converter 40 (therefore such common terminal will be indicated in the following with "common terminal 3"). It should be noted that the plurality of reference capacitors 41, 42, ... 44, 45 (having equal capacitance values) is equivalent to a corresponding plurality of capacitors 41', 42', ... 44', 45' with capacitance having half values with respect to the former capacitance, starting from capacitor 45' to capacitor 41', wherein the capacitor 45' is associated to the most significant bit of the successive-approximation algorithm, while the capacitor 41' is associated to the least significant bit of the successive-approximation algorithm; for example, the capacitance of the capacitor 44' is half the capacitance of capacitor 45' and the capacitance of the capacitor 41' is half the capacitance of capacitor 42'. Moreover, the value of the capacitance of the reference capacitors 41, 42, ... 44, 45 is equal to the value of the capacitance of the sampling capacitors 21, 22, ... 24, 25. The digital-to-analog converter 40 further includes a plurality of switches 46, 47, ... 48, 49 adapted to switch, as a function of the control signal S1, between a first and a second position for connecting the second terminals (that is the ones different from the common terminal 3) of the plurality of reference capacitors 41, 42, ... 44, 45 to a low reference voltage VrefL' or to a high reference voltage VrefH' (greater than the low reference voltage VrefL') respectively, when the analog-to-digital converter 1 is configured to operate in the phase of execution of the successive-approximation algorithm of the test operation mode. Moreover, the switches 46, 47, ... 48, 49 are structured to be configured (by means of the control signal S1) for connecting the second terminals of the plurality of reference capacitors 41, 42, ... 44, 45 to the low reference voltage VrefL' or to the high reference voltage VrefH', when the analog-to-digital converter 1 is configured to operate in the normal operation mode (for example, all the second terminals of the plurality of the reference capacitors 41, 42, ... 44, 45 are connected to the low reference voltage VrefL').

Preferably, the second generator 30 includes a comparator 31 having a sampling input terminal 37 that is connected to the common terminal 2, includes a reference input terminal 38 that is connected to the common terminal 3 and includes an output terminal 39 on which is generated a logic value '1' when the value on the sampling input terminal 37 is smaller than the value of reference terminal 38 and a logic value '0' when the value on the sampling input terminal 37 is greater than the value of the reference terminal 38. The second generator 30 further includes switches 35, 36 controlled by a switching signal S2 and a N-bit register 32 connected to the output terminal 39 for storing the output digital value $S_N$.

According to the first embodiment of the disclosure, the controller 50 is structured to generate the configuration signal S3 to control:

the switches 26, 27, ... 28, 29 to connect the second terminals of the respective sampling capacitors 21, 22, ... 24, 25 to the input analog value $V_{in}$, when the analog-to-digital converter 1 operates in the sampling phase of the normal operation mode;

the switches 26, 27, ... 28, 29 to connect the second terminals of the respective sampling capacitors 21, 22, ... 24, 25 to the high reference voltage VrefH or to the low reference voltage VrefL, when the analog-to-digital converter 1 operates in the conversion phase of the normal operation mode;

at least two of the switches 26, 27, ... 28, 29 to connect the second terminals of at least two of the respective sampling capacitors 21, 22, ... 24, 25 to the high reference voltage VrefH or to the low reference voltage VrefL, when the analog-to-digital converter 1 operates in the configuration phase of the test operation mode, as it will be described more in detail afterwards.

Moreover, according to the first embodiment of the disclosure, the controller 50 generates the control signal S1 for:

configuring the switches 46, 47, ... 48, 49 to connect the second terminals of the respective reference capacitors 41, 42, ... 44, 45 to the high reference voltage VrefH' and/or to the low reference voltage VrefL' with a fixed configuration when the analog-to-digital converter 1 is configured to operate in the sampling and conversion phase of the normal operation mode;

configuring the switches 46, 47, ... 48, 49 to connect the second terminals of the respective reference capacitors 41, 42, ... 44, 45 to the high reference voltage VrefH' and/or to the low reference voltage VrefL' with a fixed configuration when the analog-to-digital converter 1 operates in the configuration phase of the test operation mode;

controlling the switches 46, 47, ... 48, 49 to connect the second terminals of the respective reference capacitors 41, 42, ... 44, 45 to the high reference voltage VrefH' or to the low reference voltage VrefL' when the analog-to-digital converter 1 to operate in the phase of execution of the successive-approximation algorithm of the test operation mode, as will be explained more in detail afterwards;

the switching signal S2 to control the switches 35 and 36 in the closed position when the analog-to-digital converter 1 operates in the sampling phase of the normal operation mode and in the open position when the analog-to-digital converter 1 operates in the conversion phase of the normal operation mode.

Moreover, according to the first embodiment of the disclosure, the controller 50 generates the switching signal S2 to control the switches 35 and 36 in the closed position when the analog-to-digital converter 1 operates in steps a) and b) of the configuration phase of the test operation mode, in the open position when the analog-to-digital converter 1 operates in steps c) and d) of the configuration phase of the test operation mode, and in the open position when the analog-to-digital converter 1 operates in the phase of execution of the successive-approximation algorithm of the test operation mode, as will be explained more in detail afterwards.

Switches 35 and 36 are designed to switch, depending on the switching signal S2 generated by the controller 50, between the closed position wherein the input terminals are connected to a common reference voltage $V_{cm}$ and the open position.

Figure 3:
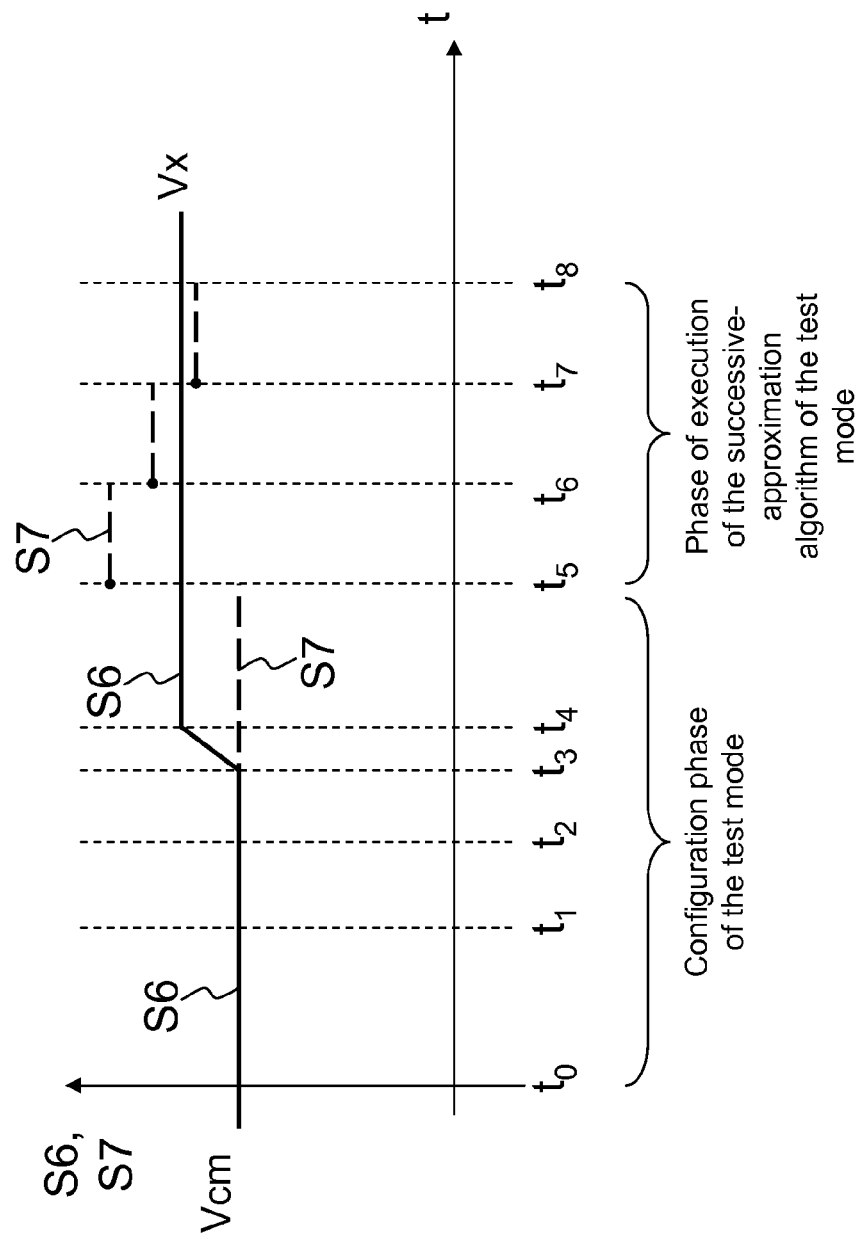
FIG. 3 schematically shows a possible pattern of two signals which can be generated in the analog-to-digital converter according to the first embodiment of the disclosure.

FIG. 3 schematically shows the pattern of the voltage signal S6 (solid line) at the common terminal 2 and of the voltage signal S7 (broken line) at the common terminal 3 when the analog-to-digital converter 1 operates in the test mode.

It should be noted that the voltage signal S6 is first equal to the common reference voltage $V_{cm}$, then it has a variation from the value of the common reference voltage $V_{cm}$ to the first voltage analog value $V_x$ and finally is equal to the first voltage analog value $V_x$, while the voltage signal S7 is first equal to the common reference voltage $V_{cm}$, and then it converges to the first voltage analog value V.

Described hereinafter is the operation of the analog-to-digital converter 1 during the normal operation mode.

In the normal operation mode, the analog-to-digital converter 1 operates first according to a sampling phase and then according to a conversion phase.

Switches 46, 47, . . . 48, 49 connect the second terminals of the reference capacitors 41, 42, . . . 44, 45 to a fixed configuration, both during the sampling phase and during the conversion phase of the normal operation mode. For example, all the second reference terminals 41, 42, . . . 44, 45 are connected to the low reference voltage VrefL'.

Moreover, the impedance of the input sampling terminal 37 of the comparator 31 and the impedance of the input reference terminal 38 of the comparator 31 are of the capacitive type.

During the sampling phase of the normal operation mode, the controller 50 generates the switching signal S2, which closes the switches 35, 36, and generates the configuration signal S3, which connects switches 26, 27, . . . 28, 29 to the input voltage $V_{in}$ analog value. Consequently, the voltage at the ends of the sampling capacitors 21, 22, . . . 24, 25 is equal to the difference between the common reference voltage $V_{cm}$ and the analog value of the input voltage $V_{in}$. Because in the example the switches 46, 47, . . . 48, 49 connect the second terminals of the reference capacitors 41, 42, . . . 44, 45 to the low reference voltage VrefL', the voltage at the ends of the reference capacitors 41, 42, . . . 44, 45 is equal to the difference between the common reference voltage $V_{cm}$ and the low reference voltage VrefL'.

During the conversion phase of the normal operation mode, the controller 50 generates a switching signal S2, which opens the switches 35 and 36 and carries out a successive-approximation algorithm, generating the configuration signal S3 which connects the switches 26, 27 . . . 28, 29 to the high reference voltage VrefH or to the low reference voltage VrefL. Since this successive-approximation algorithm is known to those skilled in the art, it will not be described in detail.

At the end of the conversion phase, the difference between the voltage of the common terminal 2 and the voltage of the common terminal 3 is smaller than the minimum resolution of the analog-to-digital converter. The second terminals of the sampling capacitors 21, 22, . . . 24, 25 are connected (by means of the switches 26, 27, . . . 28, 29) to the high reference voltage VrefH or to the low reference voltage VrefL, as a function of the value of the digital signal $S_N$. Moreover, because the impedance of the reference terminal 3 of the comparator 31 is of a capacitive type, the voltage of the common terminal 3 of the plurality of reference capacitors 41, 42, 43, 44 is equal to the common reference voltage $V_{cm}$.

Therefore, at the end of the conversion the N-bit register 32 stores the N-bit digital value corresponding to the digital conversion of the input analog value $V_{in}$.

Described hereinafter is the operation of the analog-to-digital converter 1 during the test operation mode of the analog-to-digital converter 1 with reference to FIGS. 2A, 2B, 2C, 2D, and 3.

As previously indicated, the analog-to-digital converter 1 in the test operation mode includes a configuration phase and a subsequent phase of execution of the successive-approximation algorithm. The configuration phase is between times $t_0$ and $t_5$ (excluded) shown in FIG. 3, while the phase of execution of the successive-approximation algorithm is between times $t_5$ and $t_8$. Moreover, for a correct operation of the analog-to-digital converter 1, it is assumed that there are no failures or degradations of components inside the analog-to-digital converter 1.

Configuration Phase of the Test Operation Mode

In the configuration phase of the test operation mode, the controller 50 generates a sequence of values of the configuration signal S3 for configuring at least two of the switches 26, 27, . . . 28, 29 in order to connect the second terminals of at least two of the respective sampling capacitors 21, 22, . . . 23, 24 to the high reference voltage VrefH or to the low reference voltage VrefL (while the second terminals of other sampling capacitors are floating). For the sake of simplicity, consider the example wherein the controller 50 generates a sequence of values of the configuration signal S3 for configuring the two switches 26, 27 in order to connect the second terminals of the two sampling capacitors 21, 22 to the high reference voltage VrefH or to the low reference voltage VrefL (while the second terminals of the other sampling capacitors 24, 25 are floating) and the controller 50 generates the sequence of values of the configuration signal S3 according to the steps a), b), c), d) explained afterwards.

In the configuration phase of the test mode, switches 46, 47, . . . 48, 49 connect the second terminals of the reference capacitors 41, 42, . . . 44, 45 to a fixed configuration. Advantageously, all the second terminals of the reference capacitors 41, 42, . . . 44 are connected to the low reference voltage VrefL' and the capacitor 45 to the high reference voltage VrefH', so that in the phase of execution of the successive-approximation algorithm of the test mode it is possible to detect a variation of the voltage signal S6 leading the voltage signal S6 to a value both greater and smaller than the value of the voltage signal S7. FIG. 3 shows the example wherein between times $t_3$ and $t_4$ of the configuration phase occurs a variation of the voltage signal S6 leading the voltage signal S6 to a value greater than the value of the voltage signal S7.

The configuration phase of the test mode includes the following steps a-d.

Steps a and b generate part of the sequence of values of the configuration signal S3 to initialize the values of the voltage at the ends of the sampling capacitors 21 and 22.

Step a)

Figure 2A:
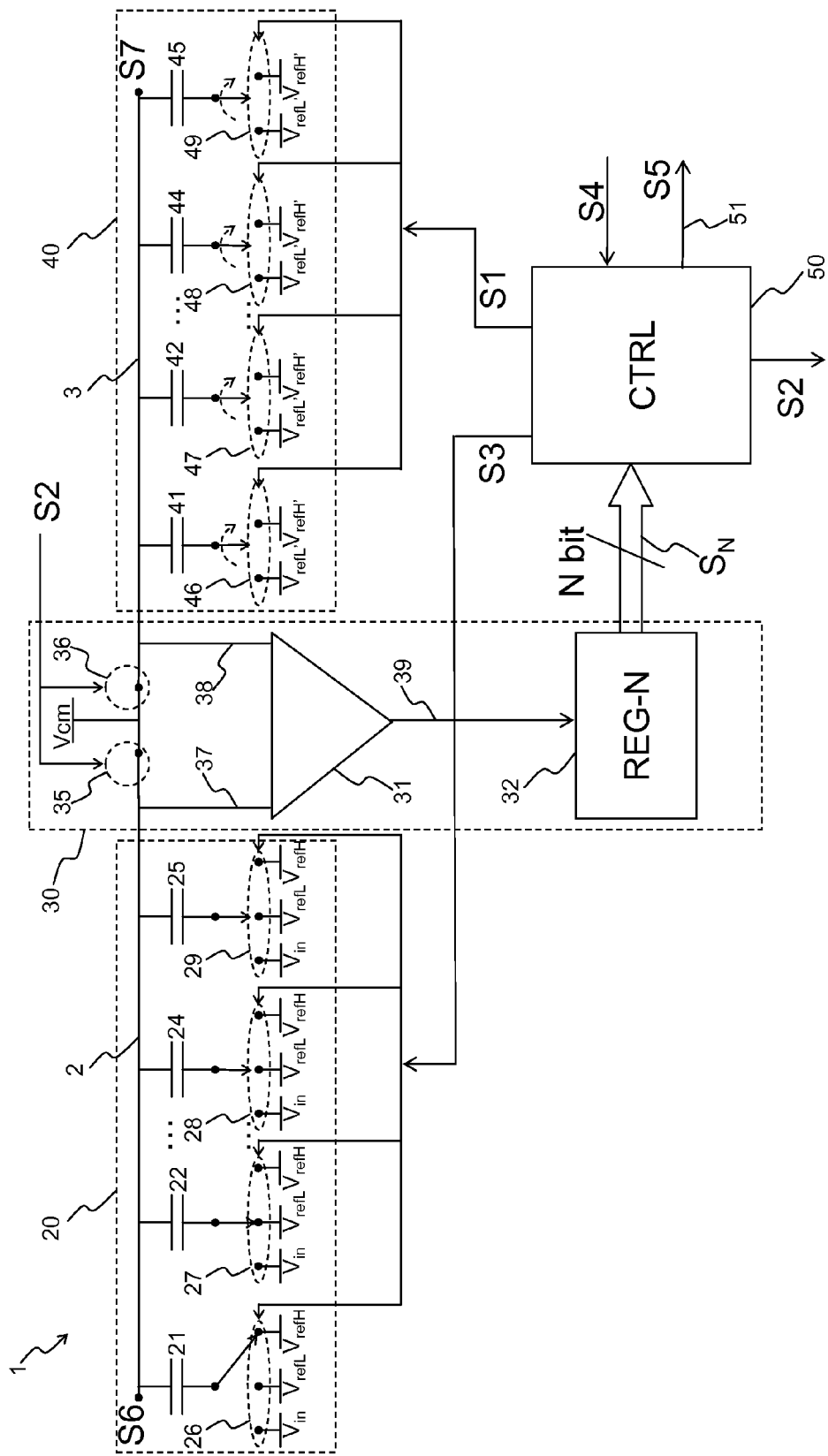
FIGS. 2A, 2B, 2C, 2D schematically show several steps of a test operation mode of the analog-to-digital converter according to the first embodiment of the disclosure.

Step a) is between times $t_0$ and $t_1$ (excluded) as shown in FIG. 3. At time $t_0$ the controller 50 generates the first values of the sequence of the configuration signal S3, which configures the switches 26 and 27 to connect the second terminal of the capacitor 21 to the high reference voltage VrefH and connecting the second terminal of the capacitor 22 to the low reference voltage VrefL, as schematically shown in FIG. 2A. Moreover, the controller 50 generates the switching signal S2, which closes the switches 35 and 36 (see FIG. 2A). In this way the common terminal 2, the input sampling terminal 37, the common terminal 3, and the input reference terminal 38 are connected to the common reference voltage $V_{cm}$. Consequently, the value of the voltage signal S6 at the common terminal 2 and the value of voltage signal S7 at the common terminal 3 are equal to the common reference voltage $V_{cm}$ (as shown in FIG. 3 at time $t_0$). In addition, the value of voltage at the ends of the capacitor 21 is equal to the difference between the high reference voltage VrefH and the common reference voltage $V_{cm}$, and the voltage value at the ends of the capacitor 22 is equal to the difference between the common reference voltage $V_{cm}$ and the high reference voltage VrefL.

Step b)

Figure 2B:
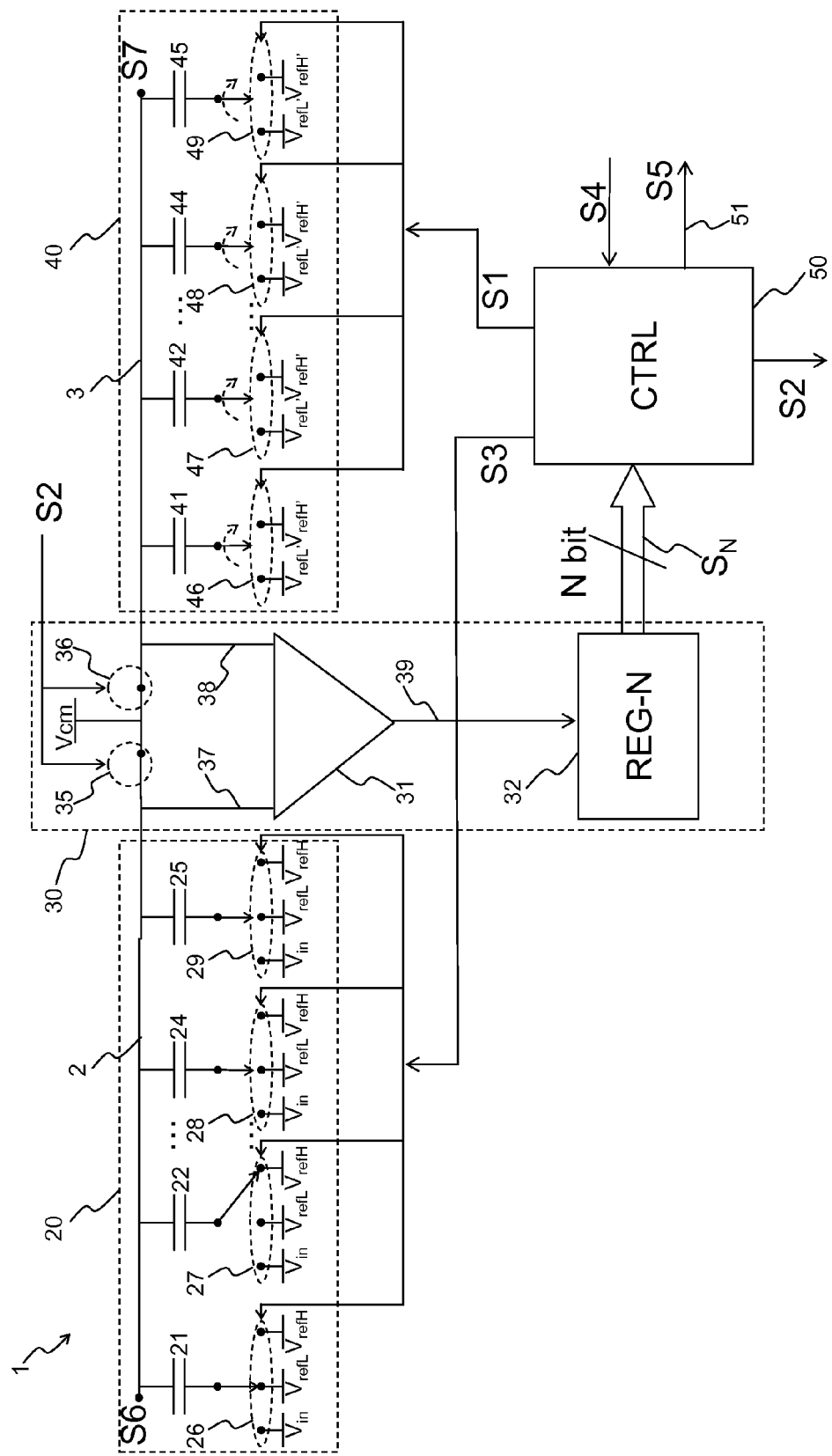
Figure 2C:
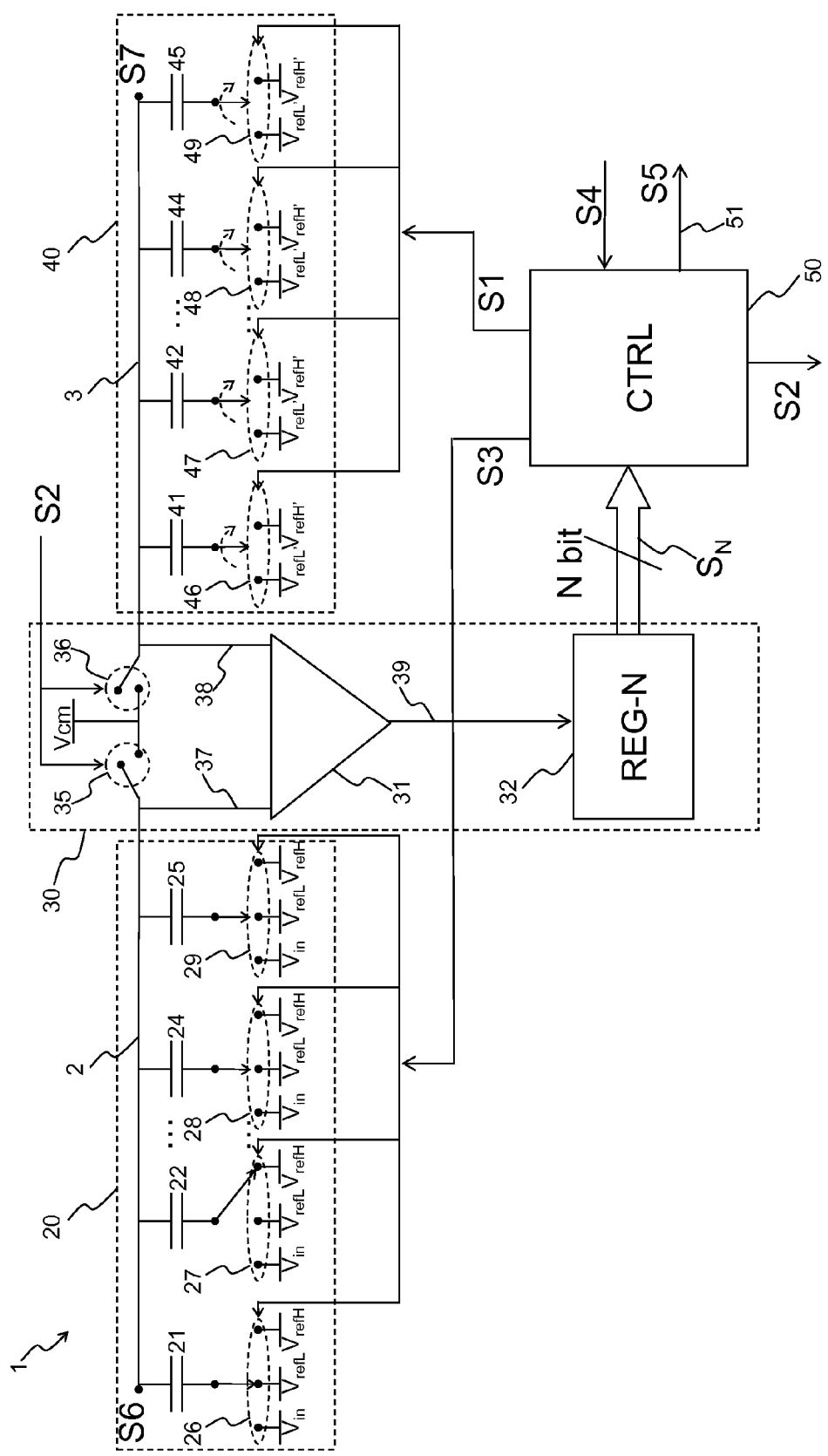

Step b) is between times $t_1$ and $t_2$ (excluded) shown in FIG. 3. At time $t_1$ the controller 50 generates second values of the sequence of the configuration signal S3, which performs a first inversion of voltage of the second terminals of sampling capacitors 21, 22. That is, it configures the switches 26 and 27 connecting the second terminal of the capacitor 21 to the low reference voltage VrefL and connects the second terminal of the capacitor 22 to the high reference voltage VrefH, as schematically shown in FIG. 2B. Moreover, the controller 50 generates the switching signal S2, which keeps closed the switches 35 and 36 (see FIG. 2B). Consequently, the value of the voltage signal S6 at the common terminal 2 and value of the voltage signal S7 at the common terminal 3 is equal to the common reference voltage $V_{cm}$ (as shown in FIG. 3 at time $t_1$), the value of the voltage at the ends of the capacitor 21 is equal to the difference between the common reference voltage $V_{cm}$, and the low reference voltage VrefL and the value of voltage at the ends of the capacitor 22 is equal to the difference between the common reference voltage $V_{cm}$ and the high reference voltage VrefH.

Therefore, the amount of charge $Q_1$ accumulated into the capacitors 21 and 22 in step b) can be expressed by the following formula (1):

$$Q_1 = -C_{22}*(VrefH - V_{cm}) + C_{21}*(V_{cm} - VrefL) \quad (1)$$

wherein $C_{21}$ is the value of the capacitance of the capacitor 21 and $C_{22}$ is the value of the capacitance of the capacitor 22.

Step c)

Step c) is between times $t_2$ and $t_3$ (excluded) shown in FIG. 3.

At time $t_2$, the controller 50 generates the switching signal S2, which opens the switches 35 and 36 (see FIG. 2C), keeping the same configuration of step b) for switches 26 and 27. At times between $t_2$ and $t_3$ the voltage signal S6 at the common terminal 2 and the voltage signal S7 at the common terminal 3 keep the value of the common reference voltage $V_{cm}$, as shown in FIG. 3.

Step d)

Step d) is between times $t_3$ and $t_4$ shown in FIG. 3.

Step d) has the purpose to generate at the common terminal 2 the first analog value $V_x$, which will be calculated afterwards.

Figure 2D:
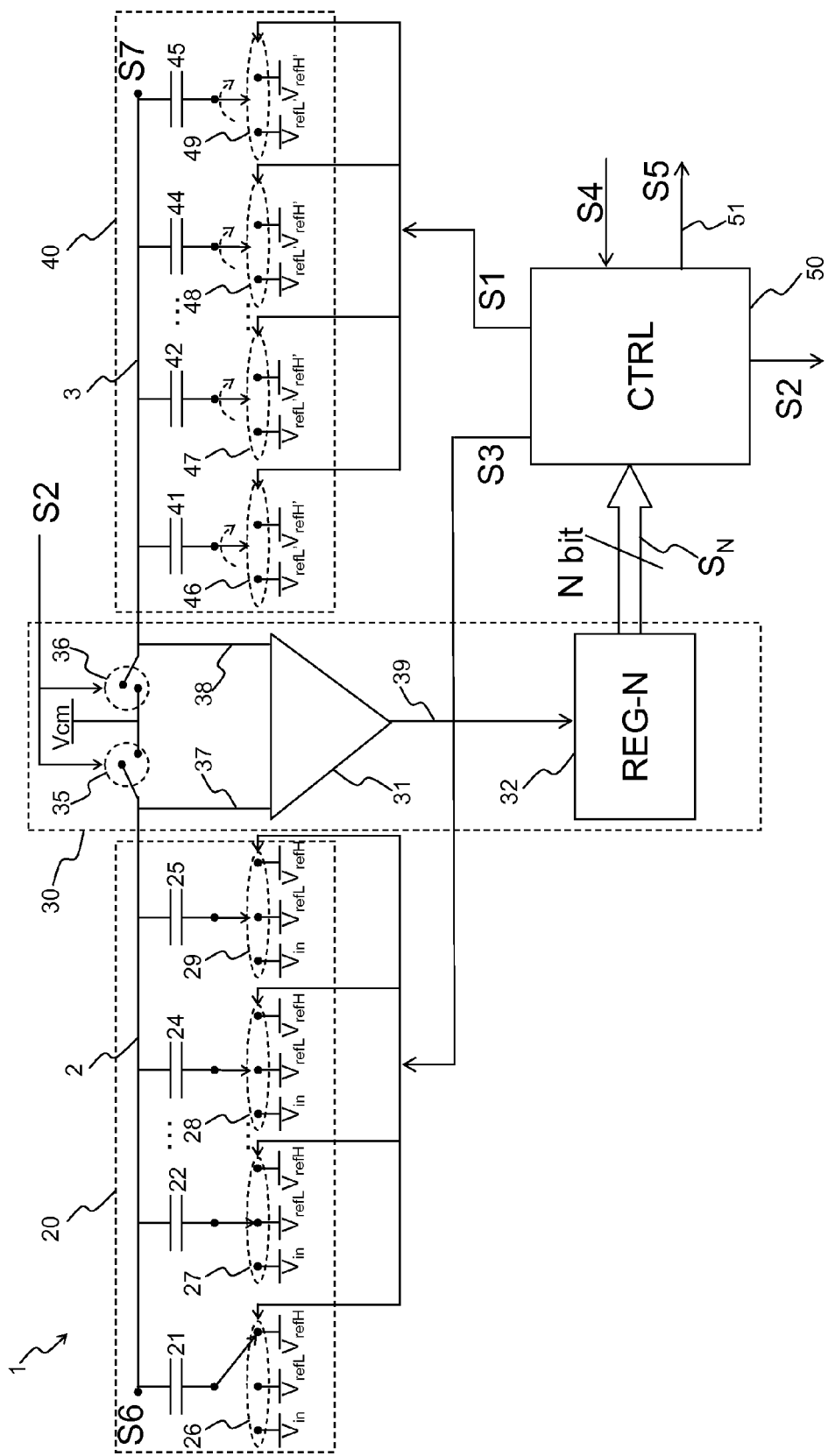

At time $t_3$ the controller 50 generates third values of the sequence of configuration signal S3, which performs a second inversion of the voltage of the second terminals of the sampling capacitors 21, 22. That is, it configures switches 26 and 27 connecting the second terminal of the capacitor 21 to the high reference voltage VrefH and connecting the second terminal of the capacitor 22 to the low reference voltage VrefL, as schematically shown in FIG. 2D. Moreover, the controller 50 generates the switching signal S2, which keeps open the switches 35 and 36 (see FIG. 2D).

At times comprised between $t_3$ and $t_4$, the voltage signal S6 at the common terminal 2 has a variation from the value of the common reference voltage $V_{cm}$ to the first voltage analog value $V_x$ (as shown in FIG. 3), while the voltage signal S7 at the common terminal 3 keeps the value of the common reference voltage $V_{cm}$ (as shown in FIG. 3).

Consequently, at time $t_4$ the voltage value at the ends of the capacitor 21 is equal to the difference between the first voltage analog value $V_x$ (whose value will be calculated in the following) and the high reference voltage VrefH and the voltage value at the ends of the capacitor 22 is equal to the difference between the first voltage analog value $V_x$ and the low reference voltage VrefL.

Therefore the quantity of charge $Q_2$ accumulated into the capacitors 21 and 22 in step d) can be expressed by the following formula (2):

$$Q_2 = -C_{22}*(V_x - VrefL) - C_{21}*(VrefH - V_x) \quad (2)$$

wherein $V_x$ is the first voltage analog value of the common terminal 2.

Because the impedance of the sampling and reference input terminals 37 and 38 of the comparator 31 are of a capacitive type and because the switches 35 and 36 are open, the charge accumulated into the capacitors 21 and 22 cannot change between step b) and step d). Therefore it is possible to calculate the first voltage analog value $V_x$ of the terminal 2 making equal the charge $Q_1$ accumulated in step b) to the charge $Q_2$ accumulated in step d):

$$-C_{22}*(VrefH - V_{cm}) + C_{21}*(V_{cm} - VrefL) = C_{22}*(V_x - VrefL) - C_{21}*(VrefH - V_x) \quad (3)$$

from which the first voltage analog value $V_x$ of the common terminal 2 can be obtained:

$$V_x = V_{cm} + (VrefH - VrefL)*(C_{21} - C_{22})/(C_{21} + C_{22}) \quad (4)$$

Since in the ideal case the values of the capacitance $C_{21}$ and $C_{22}$ are equal, in the ideal case the first voltage analog value $V_x$ is equal to the value of common reference voltage $V_{cm}$.

On the contrary, in the real case the values of the capacitance $C_{21}$ and $C_{22}$ have some tolerances (for example caused by the manufacturing process) and thus the values of the capacitance $C_{21}$ and $C_{22}$ are slightly different. In this case it is possible to foresee a range of possible values of the capacitance $C_{21}$ and $C_{22}$. Consequently, in the real case and in the hypothesis of a correct operation of the analog-to-digital converter 1, the first voltage analog value $V_x$ can take a range of correct values between $V_{x,min}$ and $V_{x,max}$ and this range is centered around the common reference voltage $V_{cm}$, where $V_{x,min}$ and $V_{x,max}$ are known values that depend on the tolerances of the values of capacitance $C_{21}$ and $C_{22}$.

Therefore at the end of the step d) of the configuration phase of the test mode, by means of the sequence of values of configuration signal S3, it has been generated the first voltage analog value $V_x$ at the common terminal 2, as shown in FIG. 3 wherein the value of the voltage signal S6 at the common terminal 2 at time $t_4$ is equal to $V_x$. This first voltage analog value $V_x$ is a value that will be used at the end of step e) of the phase of execution of the successive-approximation algorithm of the test mode for performing the test of the operation of the analog-to-digital converter 1, by means of a comparison of the digital value $S_N$ stored into register 32 with respect to one or more pre-defined values (that are known), wherein the digital value $S_N$ corresponds to the digital conversion of the first voltage analog value $V_x$.

Therefore steps a)-d) perform the initialization and the configuration of a pair of the plurality of the sampling capacitors 21, 22, ..., 24, 25.

The voltage value at the common terminal 2 remains substantially equal to the first voltage analog value $V_x$ also in the subsequent times of the phase of execution of the successive-approximation algorithm of the test operation mode, as shown in FIG. 3 between times $t_5$ and $t_8$; similarly, at the same times comprised between $t_5$ and $t_8$ the second terminals of the capacitors 21 and 22 remain connected as described in step d) (that is the second terminal of the capacitor 21 remains connected to the high reference voltage VrefH and the second terminal of the capacitor 22 remains connected to the low reference voltage VrefL).

Phase of Execution of the Successive-Approximation Algorithm of the Test Operation Mode Step e)

The phase of execution of the successive-approximation algorithm consists of step e) between times $t_5$ and $t_8$ shown in FIG. 3. In the step e) a successive-approximation algorithm is carried out on the plurality of reference capacitors 41, 42, . . . 44, 45 of the digital-to-analog converter 40. The controller 50 generates the switching signal S2, which keeps open the switches 35, 36 and carries out (times $t_5$, $t_6$, $t_7$, $t_8$) the successive-approximation algorithm, generating the control signal S1 in order to connect the switches 46, 47, . . . 48, 49 to the high reference voltage VrefH' or to the low reference voltage VrefL'. Since such a successive-approximation algorithm is known to one skilled in the field, it will not be described in detail. It should be noted only that in case of a correct operation of the analog-to-digital converter 1, at the end of the phase of execution of the successive-approximation algorithm of the test operation mode such successive-approximation algorithm is such that the voltage signal S7 at common terminal 3 has a pattern converging to a second voltage analog value near the first voltage analog value $V_x$ of the common terminal 2 (as schematically shown in FIG. 3 between times $t_7$ and $t_8$), wherein $V_x$ can take a range of possible values and this range is centered around the common reference voltage $V_{cm}$ (as previously explained in the formula for calculating $V_x$).

Moreover, supposing again a correct operation of the analog-to-digital converter 1, at the end of the phase of execution of the successive-approximation algorithm of the test operation mode the digital value $S_N$ stored into the register 32 corresponds to the digital conversion of the first analog value V. That is, the digital value $S_N$ is substantially equal to the digital conversion of the common reference voltage $V_{cm}$. The first analog value $V_x$ takes correct values in a range between $V_{x,min}$ and $V_{x,max}$ and is centered around the common reference voltage value $V_{cm}$, wherein $V_{x,min}$ and $V_{x,max}$ are known values depending on the tolerances of the sampling capacitors 21, 22, . . . , 24, 25 (as previously explained in the formula for calculating $V_x$). Consequently, the digital value $S_N$ takes correct values in a range between $S_{N,min}$ and $S_{N,max}$, wherein $S_{N,min}$ is a known value corresponding to the digital conversion of $V_{x,min}$, and $S_{N,max}$ is a known value corresponding to the digital conversion of $V_{x,max}$. The second terminals of the reference capacitors 41, 42, . . . 44, 45 at the end of the phase of execution of the successive-approximation algorithm of the test operation mode are connected (by means of the switches 46, 47, . . . 48, 49) to the high reference voltage VrefH' or to the low reference voltage VrefL', as determined by the successive-approximation algorithm carried out on the plurality of reference capacitors 41, 42, . . . 44, 45.

In the preceding description of the operation of the analog-to-digital converter 1 it has been supposed that there are no failures or degradations of the components inside the analog-to-digital converter 1. If, on the contrary, there is a failure or a degradation of a component inside the analog-to-digital converter 1 (for example, a failure of capacitors 21 or 22), in the above mentioned example the first voltage analog value $V_x$ is substantially different from the common reference voltage value $V_{cm}$. That is, the first voltage analog value $V_x$ is outside the range between $V_{x,min}$ and $V_{x,max}$ and is centered around the common reference voltage $V_{cm}$ value. Consequently, the digital value $S_N$ takes values that are outside the range of values between $S_{N,min}$ and $S_{N,max}$.

Moreover, it is also possible to determine the type of failure or degradation, as it will be explained more in detail afterwards.

It will be indicated in the following examples of failures that can be detected in the test operation mode of the analog-to-digital converter 1 according to the first embodiment of the disclosure by means of the configuration of the two sampling capacitors 21, 22 (steps a)-d)) and of the execution of the successive-approximation algorithm (step e)).

EXAMPLES

Example 1

The failure is an open circuit between the sampling capacitor 22 and the high reference voltage VrefH. In this case, in step b) the voltage of the capacitor 22 is not charged to the value (VrefH–$V_{cm}$) and keeps the value (VrefL–$V_{cm}$) of step a).

Therefore formula (3) becomes the following (the first voltage analog value is indicated by $V_{x1}$);

$$-C_{22}*(VrefL-V_{cm})+C_{21}*(V_{cm}-VrefL)=C_{22}*(V_{x1}-VrefL)-C_{21}*(VrefH-V_{x1}) \quad (3a)$$

Therefore the formula (4) of the first voltage analog value $V_{x1}$ becomes the following:

$$V_{x1}=V_{cm}+(VrefH-VrefL)*C_{21}/(C_{21}+C_{22}) \quad (4a)$$

The value of $V_{x1}$ in formula (4a) is different from the value $V_x$ of the formula (4). Therefore the value $V_{x1}$ will be outside the range of the correct values comprised between $V_{x,min}$ and $V_{x,max}$, and thus the digital value $S_{N1}$ (corresponding to the digital conversion of $V_{x1}$) will be outside the range of the correct values between $S_{N,min}$ and $S_{N,max}$ (wherein $S_{N,min}$ is the digital conversion of $V_{x,min}$ and $S_{N,max}$ is the digital conversion of $V_{x,max}$).

Similar considerations can be done in the case of an open circuit between capacitor 21 and the high reference voltage VrefH.

Example 2

The failure is an open circuit between the sampling capacitor 22 and the low reference voltage VrefL. In this case, during step d) the voltage of the capacitor 21 is not charged to value ($V_x$–VrefL) and keeps the value ($V_{cm}$–VrefH) of step c). In this case, the formula (3) becomes the following (the first voltage analog value is indicated by $V_{x2}$):

$$-C_{22}*(VrefH-V_{cm})+C_{21}*(V_{cm}-VrefL)=C_{22}*(V_{cm}-VrefH)-C_{21}*(VrefH-V_{x2}) \quad (3b)$$

Therefore the formula (4) of the first voltage analog value $V_{x2}$ becomes the following:

$$V_{x2}=V_{cm}+VrefH-VrefL \quad (4b)$$

In the hypothesis that $V_{cm}$=(VrefH+VrefL)/2, the formula (4b) becomes the following:

$$V_{x2}=(VrefH+VrefL)/2+VrefH-VrefL \quad (4c)$$

Therefore the value $V_{x2}$ in the formula (4c) is different from the value $V_x$ of the formula (4). The value $V_{x2}$ will be outside the range of the correct values between $V_{x,min}$ and $V_{x,max}$, and thus the digital value $S_{N2}$ (corresponding to the digital conversion of $V_{x2}$) will be outside the range of the correct values between $S_{N,min}$ and $S_{N,max}$ (wherein $S_{N,min}$ is the digital conversion of $V_{x,min}$ and $S_{N,max}$ is the digital conversion of $V_{x,max}$).

Similar considerations can be done in the case of an open circuit between the capacitor 21 and the low reference voltage VrefL.

Example 3

The failure is a short-circuit between the sampling capacitor 22 and the high reference voltage VrefH. In this case, during step d) the voltage of the capacitor 22 is not charged to the value (VrefL−$V_{x3}$), but it is equal to the value ($V_f$−$V_{x3}$), wherein $V_f$ is a voltage between VrefH and VrefL, whose value depends on the resistance $R_H$ of the switch 27 between the capacitor 22 and the high reference voltage VrefH and depends on the resistance $R_L$, of the switch 27 between the capacitor 22 and the low reference voltage VrefL, according to the following formula:

$$V_f = VrefH*[RL/(RF+RL)]+VrefL*[RH/(RH+RL)] \qquad (5c)$$

In this case the formula (3) becomes the following (the first voltage analog value is indicated with $V_{x3}$):

$$-C_{22}*(VrefH-V_{cm})+C_{21}*(V_{cm}-VrefL)=C_{22}*(V_{x3}-V_f)-C_{21}*(VrefH-V_{x3}) \qquad (3c)$$

Therefore the formula (4) of the first voltage analog value $V_{x3}$ becomes the following:

$$V_{x3}=V_{cm}+VrefH*[(C_{21}-C_{22})*(C_{22}+C_{21})]+(C_{22}*V_f-C_{21}*VrefL)/(C_{22}+C_{21}) \qquad (4c)$$

In the hypothesis that the value $V_f$ is sufficiently different from the value of the low reference voltage VrefL, the value $V_{x3}$ of the formula (4c) is different from the value $V_x$ of the formula (4). Therefore the value $V_{x3}$ will be outside the range of the correct values between $V_{x,min}$ and $V_{x,max}$, and thus the digital value $S_{N3}$ (corresponding to the digital conversion of $V_{x3}$) will be outside the range of the correct values between $S_{N,min}$ and $S_{N,max}$ (wherein $S_{N,min}$ is the digital conversion of $V_{x,min}$ and $S_{N,max}$ is the digital conversion of $V_{x,max}$).

Similar considerations can be done in the case of a short-circuit between the capacitor 21 and the high reference voltage VrefH.

Example 4

The failure is a short-circuit between the sampling capacitor 22 and the low reference voltage VrefL. In this case, in step b) the voltage of the capacitor 22 is not charged to the value (VrefH−$V_{cm}$), but it is equal to the value ($V_f$−$V_{cm}$), wherein $V_f$ has the value indicated in the formula (5c).

In this case, the formula (3) becomes the following (the first voltage analog value is indicated with $V_{x4}$):

$$-C_{22}*(V_f-V_{cm})+C_{21}*(V_{cm}-VrefL)=C_{22}*(V_{x4}-VrefL)-C_{21}*(VrefH-V_{x4}) \qquad (3d)$$

Therefore the formula (4) of the first voltage analog value $V_{x4}$ becomes the following:

$$V_{x4}=V_{cm}+VrefL*[(C_{22}-C_{21})*(C_{22}+C_{21})]+(C_{21}*VrefH-C_{22}*V_f)/(C_{22}+C_{21}) \qquad (4d)$$

In the hypothesis that the value $V_f$ is sufficiently different from the high reference voltage VrefH value, the value $V_{x4}$ in the formula (4d) is different from the value $V_x$ of the formula (4). Therefore the value of $V_{x4}$ will be outside the range of the correct values between $V_{x,min}$ and $V_{x,max}$, and thus the digital value $S_{N4}$ (corresponding to the digital conversion of $V_{x4}$) will be outside the range of the correct values between $S_{N,min}$ and $S_{N,max}$ (wherein $S_{N,min}$ is the digital conversion of $V_{x,min}$ and $S_{N,max}$ is the digital conversion of $V_{x,max}$).

Similar considerations can be done for a short-circuit between the sampling capacitor 21 and the low reference voltage VrefL.

Example 5

The failure is an open circuit between the common terminal 2 of the sampling capacitor 22 and the sampling input terminal 37 of comparator 31. In this case, the sampling capacitor 22 is not charged and it is necessary to consider the parasitic capacitance (indicated with $C_p$) seen from the sampling input terminal 37 of the comparator 31.

Therefore the formula (3) becomes the following (the first voltage analog value is indicated with $V_{x5}$):

$$C_p*(V_{cm}-Vg)+C_{21}*(V_{cm}-VrefL)=C_p*(V_{x5}-Vg)-C_{21}*(VrefH-V_{x5}) \qquad (3e)$$

wherein Vg is the reference voltage of the capacitor 22, in that is the voltage of the second terminal of the capacitor 22 (typically equal to ground).

In the hypothesis that Vg is equal to ground, the formula (4) of the first voltage analog value $V_{x5}$ becomes the following:

$$V_{x5}=V_{cm}+C_{21}*(VrefH-VrefL)/(C_p+C_{21}) \qquad (4e)$$

In the hypothesis that the parasitic capacitance value $C_p$ is not greater than the capacitance value $C_{21}$, the value $V_{x5}$ of the formula (4e) is thus different from the value $V_x$ of formula (4). Therefore the value $V_{x5}$ will be outside the range of correct values between $V_{x,min}$ and $V_{x,max}$, and thus the digital value $S_{N5}$ (corresponding to the digital conversion of $V_{x5}$) will be outside the range of correct values between $S_{N,min}$ and $S_{N,max}$ (wherein $S_{N,min}$ is the digital conversion of $V_{x,min}$ and $S_{N,max}$ is the digital conversion of $V_{x,max}$).

Similar considerations can be done in case of an open circuit between the common terminal of the capacitor 21 and the sampling input terminal 37 of the comparator 31.

Advantageously, in the test mode of Examples 1-5, the second terminals of the sampling capacitors not used for performing the test (in the example, they are the capacitors different from 21, 22) are connected at a constant value voltage (for example, VrefL). This has the advantage of avoiding parasitic couplings between signals that can cause oscillating signals or noise, affecting the first voltage analog value $V_{x1}$-$V_{x5}$.

As previously indicated, at the end of the phase of execution of the successive-approximation algorithm of the test operation mode, it is checked if there is a failure or degradation of the operation of the analog-to-digital converter 1.

This can be performed inside or outside the analog-to-digital converter 1.

In the first case, the controller 50 further includes an output terminal 51 (see FIGS. 1 and 2A-D) for generating, as a function of the digital value $S_N$, an alarm signal S5 indicating the correct operation (for example, a low logic value) of the analog-to-digital converter 1 or indicating a failure (for example, a high logic value) of at least one component in the analog-to-digital converter 1 or indicating a degradation of the performance of the analog-to-digital converter 1. Specifically, the controller 50 receives the digital value $S_N$ stored into the register 32, receives the values $S_{N,min}$ and $S_{N,max}$ (for examples, they are read from a memory connected to the controller 50 or from a memory inside the controller 50, or such values are written at hardware level into the controller 50), performs a comparison between the digital value $S_N$ and the range defined between $S_{N,min}$ and $S_{N,max}$, checks if the digital value $S_N$ is in the range and generates the alarm signal S5 (in the example, the high logic value) if the digital value $S_N$ is outside the range.

In the second case, a microprocessor is connected to the analog-to-digital converter 1 and reads the digital value stored into the register 32, receives the values $S_{N,min}$ and $S_{N,max}$ (for example, they are read from a memory connected to the processor), performs a comparison between the digital value $S_N$ and the range defined between $S_{N,min}$ and $S_{N,max}$, checks if the digital value $S_N$ is comprised within the range, and generates the alarm signal S5 (in the example, the high logic value) if the digital value $S_N$ is outside the range.

Preferably, the phase of configuration and execution of the successive-approximation algorithm of the test mode is repeated for other pairs (or for all the pairs) of the sampling capacitors, that is for pairs of the sampling capacitors different from the pair 21, 22 of the previous example. This enables a determination of the position of a failure of at least one of the sampling capacitors 21, 22, ... 24, 25. Moreover, in the test mode the steps a)-e) performed on the first capacitor pair are independent from the steps a)-e) performed on the second capacitor pair. This has the advantage that it is possible to stop the test after completing the test on the first capacitor pair, in order to return to the normal operation mode. Subsequently, it is possible to resume the execution of the test mode on the second capacitor pair without the necessity of performing again the test mode on the first capacitor pair.

Advantageously, the phase of configuration and execution of the successive-approximation algorithm of the test mode is performed for a group of sampling capacitors having an even number of sampling capacitor greater than or equal to four. This has the advantage of reducing the number of the required switches 26, 27, ... , 28, 29.

Figure 4:
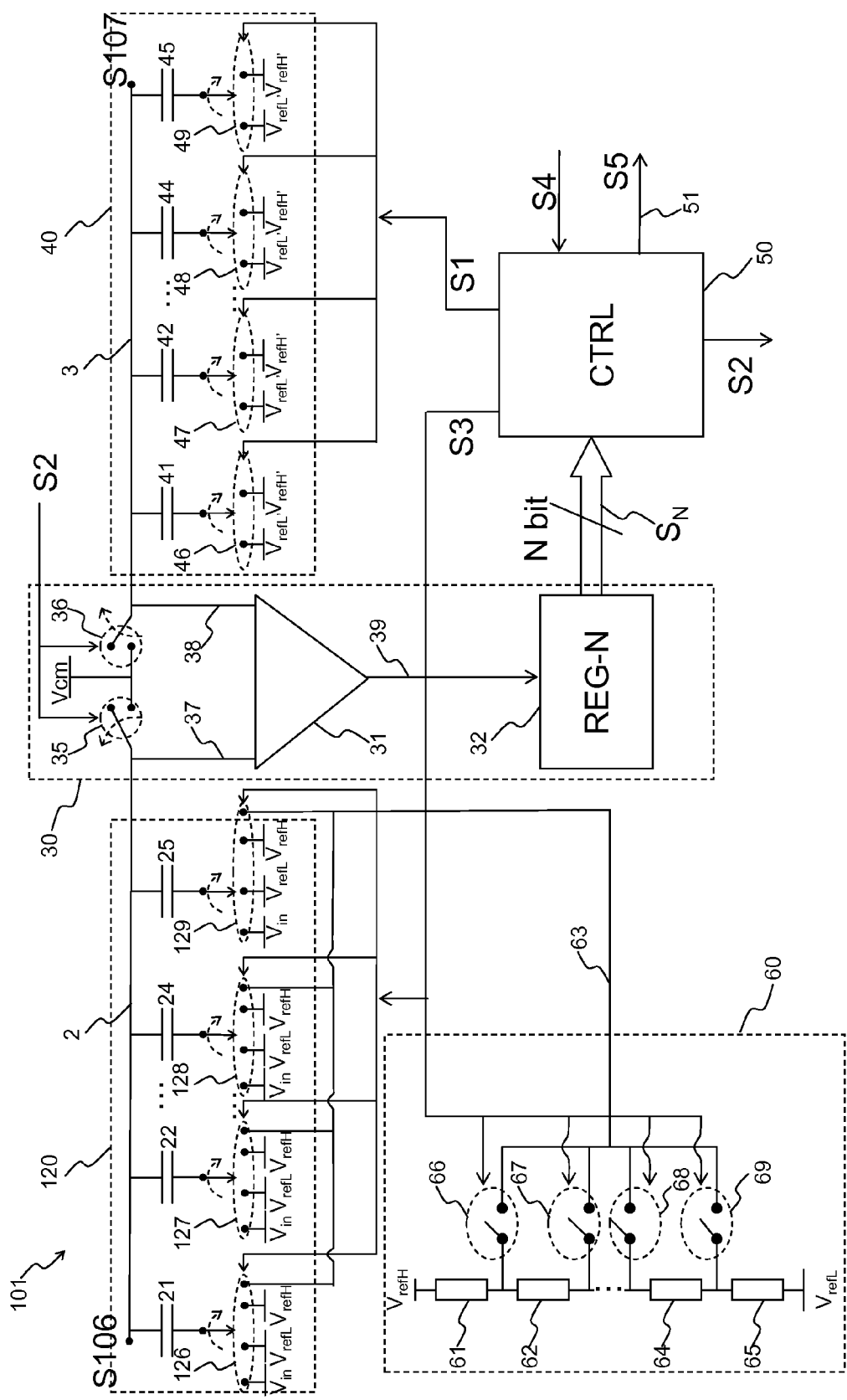
FIG. 4 schematically shows an analog-to-digital converter according to a second and third embodiments of the disclosure.

With reference to FIG. 4, it is shown an analog-to-digital converter 101 according to a second embodiment of the disclosure. It should be noted that in FIG. 4 blocks, components or modules identical (or similar) are indicated with the same reference numerals in the first embodiment shown in FIG. 1.

The analog-to-digital converter 101 further includes a resistive-type digital-to-analog converter 60 implemented with a resistive divider, that is with a series connection of a plurality of resistors 61, 62, ... 64, 64 connected between the high reference voltage VrefH and the low reference voltage VrefL, as schematically shown in FIG. 4. The resistive-type digital-to-analog converter 60 includes an output terminal 63 for providing a third voltage analog value $V_y$ comprised between the high reference voltage VrefH and the low reference voltage VrefL by means of a plurality of switches 66, 67, ... 68, 69 alternatively closed and connected between the resistors 61, 62, ... 64, 65 and the output terminal 63.

Moreover, the analog-to-digital converter 101 includes a third generator 120 (similar to the first generator 20 of the first embodiment of the disclosure) having a plurality of switches 126, 127, ... 128, 129 adapted to switch, as a function of the configuration signal S3, among a first, a second, a third, and a fourth position for connecting the second terminals of the plurality of sampling capacitors 21, 22, ... 24, 25 to the input analog value $V_{in}$, to the low reference voltage VrefL, to the high reference voltage VrefH or to the output terminal 63 of digital-to-analog converter 60 respectively.

The digital-to-analog converter 60 is structured to generate at the output terminal 63 at least the third voltage analog value $V_y$, as a function of the configuration signal S3, when the analog-to-digital converter 1 is configured to operate in the configuration phase of the test operation mode, similarly to what has been explained for the sampling phase of the normal operation mode.

It should be noted that FIG. 4 shows switches 126, 127, ... 128, 129 having four possible positions (connection to $V_{in}$, VrefL, VrefH, output terminal 63), but it is possible to obtain the same operation using the switches 126, 127, ... 128, 129 having three possible positions (connection with $V_{in}$, VrefL, VrefH) and adding another switch for connecting the output terminal 63 to the terminal having the input analog value $V_{in}$.

The operation of the analog-to-digital converter 101 according to the second embodiment of the test mode is similar to the operation of the analog-to-digital converter 1 in the normal operation mode, with the following differences:

- the value of the voltage signal S107 at the common terminal 3 is equal to the common reference voltage $V_{cm}$;
- in the test mode the controller 50 generates the control signal S1 for configuring the switches 46, 47, ... 48, 49 for connecting the second terminals of the plurality of the reference capacitors 41, 42, ... 44, 45 to a fixed configuration (for example, all the second terminals of the plurality of reference capacitors 41, 42, ... 44, 45 are connected to the low reference voltage VrefL');
- in the configuration phase of the test mode the controller 50 generates the configuration signal S3 in order to generate at the output terminal 63 the third voltage analog value $V_y$, between the high reference voltage VrefH and the low reference voltage VrefL, as a function of the closed switch selected among the plurality of switches 66, 67, ... 68, 69;
- in the configuration phase of the test mode the third voltage analog value $V_y$ is sampled by the plurality of sampling capacitors 21, 22, ... 24, 25, that is the controller 50 generates the switching signal S2, which closes the switches 35, 36 and generates the configuration signal S3, which configures the switches 126, 127, ... 128, 129 connecting the second terminals of the capacitors 21, 22, ... 24, 25 to the output terminal 63 having the third voltage analog value $V_y$;
- the phase of execution of the successive-approximation algorithm of the test mode is similar to the conversion phase of the normal operation mode. That is, the controller 50 generates a switching signal S2, which opens the switches 35 and 36 and carries out a successive-approximation algorithm for generating the configuration signal S3, which connects the switches, 126, 127, ... 128, 129 to the high reference voltage VrefH or to the low reference voltage VrefL, as a function of the digital signal value $S_N$.

Therefore in the second embodiment of the disclosure the digital value $S_N$ stored into the register 32 at the end of the operation of the test mode corresponds to the digital conversion of the third voltage analog value $V_y$.

During a correct operation of the analog-to-digital converter 101, at the end of the phase of execution of the successive-approximation algorithm of the test operation mode the digital value $S_N$ stored into the register 32 corresponds to the digital conversion of the third voltage analog value $V_y$, wherein $V_y$ can have possible values in a range centered around an ideal value of $V_y$ and depending on the tolerances of the resistors 61, 62, ... 64, 65 and on the tolerances of the sampling capacitors 21, 22, ... 24, 25. The ideal value of $V_y$ is known because is equal to the voltage value generated at output terminal 63 of the resistive-type digital-to-analog converter 60. For example, the third analog value $V_y$ has values in a range comprised between $V_{y,min}$ and $V_{y,max}$ and centered around the ideal value of $V_y$, where $V_{y,min}$ and $V_{y,max}$ are known values which depend on the tolerances of the resistors 61, 62, ... 64, 65 and on the tolerances of the sampling capacitors (caused, for example, by the manufacturing process). Consequently, the digital value $S_N$ has values in a range comprised between $S_{N,min}'$ and $S_{N,max}'$, wherein $S_{N,min}'$ has a known value corresponding to the digital conversion of $V_{y,min}$ and $S_{N,max}'$ is a known value corresponding to the digital conversion of $V_{y,max}$. The second terminals of the sampling capacitors 21, 22, ... 24, 25 at the end of the phase of execution of the successive-approximation algorithm of the test operation mode are connected (by means of the switches 126, 127, ... 128, 129) to the high reference voltage VrefH or to the low reference voltage VrefL, as determined by the successive-approximation algorithm.

In the previous description of the operation of the analog-to-digital converter 101, it was supposed that there are no failures or degradations of the components inside the analog-to-digital converter 1. If, on the contrary, there was a failure or a degradation of a component in the analog-to-digital converter 101, in the example indicated above the third voltage analog value $V_y$ is substantially different from the ideal value of $V_y$, that is the third voltage analog value $V_y$ is outside the range of correct values between $V_{y,min}$ and $V_{y,max}$. Consequently, the digital value $S_N$ has values that are outside the range of correct values comprised between $S_{N,min}'$ and $S_{N,max}'$.

The analog-to-digital converter 101 of the second embodiment of the disclosure in the test operation mode can detect failures previously indicated in the examples 1-5, and moreover it can detect failures indicated in the following other examples 6-14.

Example 6

The failure is a short-circuit of at least one of the resistors 61, 62, ... 64, 65. In this case, each of the third voltage analog values $V_y$ generated by the closure of the corresponding switch selected among 66, 67, ... 68, 69 is outside the respective range of correct values between $V_{y,min}$ and $V_{y,max}$. Consequently, each of the digital values $S_N$ (corresponding to the digital conversion of the respective third voltage analog value $V_y$) is outside the respective range of correct values between $S_{N,min}'$ and $S_{N,max}'$ (wherein $S_{N,min}'$ is the digital conversion of the respective $V_{y,min}$ and $S_{N,max}'$ is the digital conversion of the respective $V_{y,max}$).

Moreover, it is possible to detect the position of a short-circuited resistor (between 61, 62, ... 64, 65) because the third voltage analog value $V_y$ generated by the closure of the switch (selected between 66, 67, ... 68, 69) connected to a terminal of a failed resistor is equal to the third voltage analog value $V_y$ generated by the closure of the other switch (selected between 66, 67, ... 68, 69) connected to the other terminal of the failed resistor (in the same way, in case of a short-circuit between two or more resistors).

Example 7

The failure is an open circuit of at least one of the resistors 61, 62, ... 64, 65. In this case, the third voltage analog value $V_y$ generated by the closure of anyone of the switches 66, 67, ... 68, 69 that select the resistors between the failed resistor and the high reference voltage VrefH is equal to the high reference voltage value VrefH. Therefore this third voltage analog value $V_y$=VrefH is outside the range of correct values between $V_{y,min}$ and $V_{y,max}$. Consequently, the digital value $S_N$ corresponding to the digital conversion of $V_y$=VrefH is a string of bits having a high logic value (that is, "1111 ... 11"). Thus it is outside the range of correct values between $S_{N,min}'$ and $S_{N,max}'$ (wherein $S_{N,min}'$ is the digital conversion of $V_{y,min}$ and $S_{N,max}'$ is the digital conversion of $V_{y,max}$). Moreover, the third voltage analog value $V_y$ generated by the closure of anyone of the switches 66, 67, ... 68, 69 that select the resistors between the failed resistor and the low reference voltage value VrefL is equal to the low reference voltage value VrefL. Therefore this third voltage analog value $V_y$=VrefL is outside the range of correct values between $V_{y,min}$ and $V_{y,max}$. Consequently, the digital value $S_N$ corresponding to the digital conversion of $V_y$=VrefL is a string of bits having a low logic value (that is, "0000 ... 00"). Thus it is outside the range of correct values between $S_{N,min}'$ and $S_{N,max}'$ (wherein $S_{N,min}'$ is the digital conversion of $V_{y,min}$ and $S_{N,max}'$ is the digital conversion of $V_{y,max}$).

In this case it is possible to determine the position of the failed resistor between 61, 62, ... 64, 65 by performing several iterations of the test mode in the following way. It is supposed that the digital-to-analog converter 60 includes four resistors 61, 62, 64, 65 and that the open-circuited failed resistor is 62. The following iterations of the test mode are performed, wherein the controller 50 generates the configuration signal S3 in order to perform the sequential closure of the switches 66, 67, 68, 69:

the switch 66 connected to the resistor 61 is closed and thus the third voltage analog value $V_y$=VrefL;
the switch 67 connected to the resistor 62 is closed and thus the third voltage analog value $V_y$=VrefL;
the switch 68 connected to the resistor 64 is closed and thus again the third voltage analog value $V_y$=VrefL;
the switch 69 connected to the resistor 65 is closed and thus the third voltage analog value $V_y$=VrefL.

Therefore there is a transition from $V_y$=VrefH to $V_y$=VrefL between the closure of the switch 66 connected to the resistor 62 and the closure of the switch 67 (and thus the controller 50 detects that the digital value $S_N$ has a transition from a string of bits having a high logic value to a string of bits having a low logic value). This indicates that the open-circuited failed resistor is the resistor 62, interposed between the switch 66 and 67.

Example 8

The failure is at least one of the resistors 61, 62, ... 64, 65 having a resistance value substantially different from the nominal value. In this case, each of the third voltage analog values $V_y$ generated by the closure of the corresponding switch selected among 66, 67, ... 68, 69 is shifted of a determined value with respect to the correct value and thus it is outside the respective range of correct values between $V_{y,min}$ and $V_{y,max}$. Consequently, each digital values $S_N$ (corresponding to the digital conversion of the respective voltage analog value $V_y$) is outside the respective range of correct values between $S_{N,min}'$ and $S_{N,max}'$ (wherein $S_{N,min}'$ is the digital conversion of the respective $V_{y,min}$ and $S_{N,max}'$ is the digital conversion of the respective $V_{y,max}$).

Example 9

The failure is a short-circuit of at least one of the plurality of switches 66, 67, ... 68, 69. For example, in case of a failure its detection is possible performing the test by closing at least another switch (not a failed one) selected among 66, 67, ... 68, 69, in order to form a short-circuit of one or more resistors 61, 62, ... 64, 65. In this last case the third voltage analog value $V_y$ is outside the range of correct values between $V_{y,min}$ and $V_{y,max}$. Consequently, the digital value $S_N$ (corresponding to the digital conversion of the third voltage analog value $V_y$) is outside the range of correct values between $S_{N,min}'$ and $S_{N,max}'$ (wherein $S_{N,min}'$ is the digital conversion of the respective $V_{y,min}$ and $S_{N,max}'$ is the digital conversion of the respective $V_{y,max}$).

Example 10

The failure is an open circuit of at least one of the plurality of switches 66, 67, ... 68, 69. In this case, in the test mode the sampling capacitors 21, 22, . . . 24, 25 are not charged to the expected value when the failed open-circuited switch (of the plurality of switches 66, 67, . . . 68, 69) is closed. It is possible to determine the failure (and the position) of one of the plurality of switches 66, 67, . . . 68, 69 by performing several iterations of the test mode of the operation of the analog-to-digital converter 101 in the following way. It is supposed that the digital-to-analog converter 60 includes four resistors 61, 62, 64, 65 and that the failed open-circuited switch is 67. The following iterations of the test mode are performed, wherein the controller 50 generates, for each iteration, the configuration signal S3 for performing the sequential closure of the switches 66, 67, 68, 69:

at the first iteration the switch 66 (connected to the resistor 61) is closed, and thus in the configuration phase the third voltage analog value $V_y=V_{t1}$ is sampled by the plurality of sampling capacitors 21, 22, . . . 24, 25. At the end of the phase of execution of the successive-approximation algorithm of the test mode the controller 50 detects that the digital value $S_{N1}$ (corresponding to the digital conversion of $V_{y1}$) is inside the range of the correct values, thus the switch 66 is not failed;

at the second iteration the switch 67 (connected to the resistor 62) is closed but (due to the failure of the open-circuited switch 67) in the configuration phase the third voltage analog value $V_{y1}$ is not sampled by the plurality of sampling capacitors 21, 22, . . . 24, 25. In the hypothesis wherein the sampling capacitors 21, 22, . . . 24, 25 keep the value of the charge sampled at the first iteration, the third voltage analog value $V_y=V_{y1}$ and the controller 50 still detects that the digital value is $S_{N1}$ (equal to the previous step wherein the switch 66 is closed) and is outside the range of the correct values: this indicated that the switch 67 is failed.

Preferably, the following other iterations are performed:

at the third iteration the switch 68 (connected to resistor 64) is closed and in the configuration phase the third voltage analog value $V_y=V_{y3}$ is sampled by the plurality of sampling capacitors 21, 22, . . . 24, 25. At the end of the phase of execution of the successive-approximation algorithm of the test mode, the controller 50 detects that the digital value $S_{N3}$ (corresponding to the digital conversion of $V_{y3}$) is within the range of the correct values, thus the switch 68 is not failed;

at the fourth iteration, switch 69 (connected to resistor 65) is closed and during the configuration phase the third voltage analog value $V_y=V_{y4}$ is sampled by the plurality of sampling capacitors 21, 22, . . . 24, 25. At the end of the phase of execution of the successive-approximation algorithm of the test mode the controller 50 detects that digital value $S_{N4}$ (corresponding to the digital conversion of $V_{y4}$) is within the range of correct values, thus the switch 69 is not failed.

Example 11

The failure is an open-circuit of the switch 35. In this case, in the test mode the common terminal 2 of the sampling capacitors 21, 22, . . . 24, 25 is floating and the sampling capacitors 21, 22, . . . 24, 25 are connected to the parasitic capacitance (indicated with $C_p$) of the common terminal 2. The plurality of sampling capacitors 21, 22, . . . 24, 25 is charged through the parasitic capacitance $C_p$ to the value $(Vin-Vg)*C_s*C_p/(C_s+C_p)$, wherein $C_s$ is the value of the capacitance of the plurality of sampling capacitors 21, 22, . . . 24, 25, and Vg is the voltage applied to the terminal of $C_p$ not connected to the common terminal 2.

Therefore at the end of the configuration phase of the test mode, the voltage of the common terminal 2 will have the value $(Vin-Vg)*C_p/(C_s+C_p)$, which is different from the voltage of the common reference $V_{cm}$. Therefore the third voltage analog value $V_y$ is outside the range of the correct values between $V_{y,min}$ and $V_{y,max}$ and, consequently, the digital value $S_N$ (corresponding to the digital conversion of the third voltage analog value $V_y$) is outside the range of the correct values.

In the hypothesis wherein it occurs that (for a specific switch closed among the plurality of switches 66, 67, . . . 68, 69), the value $(V_{in}-Vg)*C_p/(C_s+C_p)$ of the voltage of the common terminal 2 is really equal to the voltage of the common reference $V_{cm}$, it is still possible to detect the open circuit failure of the switch 35 because the voltage of the common terminal 2 depends on the input voltage $V_{in}$. Several iterations are performed in the test mode wherein the switches 66, 67, 68, 69 are alternatively closed and it is detected that in at least one iteration the third voltage analog value $V_y$ is outside the range of correct values between $V_{y,min}$ and $V_{y,max}$ and, consequently, the digital value $S_N$ (corresponding to the digital conversion of the third voltage analog value $V_y$) is outside the range of the correct values.

Example 12

The failure is a short-circuit of the switch 35. In this case, in the test mode the voltage value of the input terminal 37 of the comparator 31 is always equal to the reference voltage $V_{cm}$ and the digital signal $S_N$ has always the same value as the selected switch among the plurality of switches 66, 67, . . . 68, 69 changes. Therefore it is possible to detect the short-circuit of the switch 35 by performing different iterations of the test mode in which it occurs the sequential closure of the switches 66, 67, 68, 69 in order to generate different values of the third voltage analog value $V_y$ and checking that the digital value $S_N$ (corresponding to the digital value of the third voltage analog value $V_y$) always keeps the same value as the selected switch among the plurality of switches 66, 67, . . . 68, 69 changes.

Example 13

The failure is a short-circuit of at least one of the sampling capacitors 21, 22, . . . 24, 25. In this case, in the test mode the voltage value of the common terminal 2 (and thus of the input terminal 37 of the comparator 31) is equal to the high reference voltage VrefH when, during the phase of execution of the successive-approximation algorithm on the plurality of sampling capacitors 21, 22, . . . 24, 25, a specific bit of the digital signal $S_N$ is evaluated. Consequently, the comparator 31 generates a low logic value for this specific bit of the digital signal $S_N$. Moreover, the voltage value of the common terminal 2 (and thus of the input terminal 37 of the comparator 31) is equal to the low reference voltage VrefL when, during the phase of execution of the successive-approximation algorithm on the plurality of sampling capacitors 21, 22, . . . 24, 25, the other bits of the digital signal $S_N$ are evaluated. Consequently, the comparator 31 generates a high logic value for the other bits of the digital signal $S_N$.

In the case wherein there are no failures in the sampling capacitors 21, 22, . . . 24, 25, as the switch closed among the plurality of switches 66, 67, . . . 68, 69 changes, the third voltage analog value $V_y$ changes and thus the digital value $S_N$ (corresponding to the digital conversion of the third voltage analog value $V_y$) changes. For example, if different iterations of the test mode are performed by successively closing the switches 66, 67, . . . 68, 69, the correct digital values $S_N$ are "000000", "000001", "000010", "000011".

In case wherein there is a short-circuit failure of at least one of the sampling capacitors 21, 22, . . . 24, 25, as the switch closed among the plurality of switches 66, 67, . . . 68, 69 changes, the third voltage analog value $V_y$ does not change and thus the digital value $S_N$ (corresponding to the digital conversion of the third voltage analog value $V_y$) is always the same string having a low logic value and all the other values high (for example, "111110", or "111101" or "111011"). This indicates the short-circuit failure of at least one of the sampling capacitors 21, 22, . . . 24, 25.

Example 14

The comparator 31 is failed. This affects the digital value $S_N$, which is outside the range of correct values comprised between $S_{N,min}$' and $S_{N,max}$'.

FIG. 4 also shows a third embodiment of the disclosure. According to the third embodiment, in the configuration phase of the test mode, the digital-to-analog converter 60 generates the third voltage analog value $V_y$ (similarly to the configuration phase of the second embodiment of the disclosure), wherein the controller 50 generates the configuration signal S3 for selecting the closure of one of the plurality of switches 66, 67, . . . 68, 69. In the configuration phase of the test mode, it is also performed the sampling of the third voltage analog value $V_y$ on the plurality of sampling capacitors 21, 22, . . . 24, 25 (similarly to the sampling of the input analog signal $V_{in}$ in the sampling phase of the normal operation mode of the first embodiment of the disclosure). That is, the controller 50 generates the configuration signal S3 for connecting the second terminals of the plurality of sampling capacitors 21, 22, . . . 24, 25 to the third voltage analog value $V_y$ and the controller 50 generates the switching signal S2 for closing the switches 35, 36.

In the subsequent phase of the test mode the successive-approximation algorithm is carried out on the plurality of reference capacitors 41, 42, . . . 44, 45 (similarly to the phase of execution of the successive-approximation algorithm of the first embodiment of the disclosure) connecting the second terminals of the plurality of reference capacitors 41, 42, . . . 44, 45 to the low reference voltage VrefL' or to the high reference voltage VrefH', by means of the switches 46, 47, . . . 48, 49 and the digital value $S_N$ (corresponding to the digital conversion of the difference between the voltage signal S106 at the common terminal 2 and the voltage signal S107 at the common terminal 3) is obtained. If the digital value $S_N$ has values in a range between $S_{N,min}$" and $S_{N,max}$" (wherein $S_{N,min}$" is a known value corresponding to the digital conversion of the difference between the minimum correct value $S106_{min}$ of the voltage signal S106 and the value of the voltage signal S107 and $S_{N,max}$" is a known value corresponding to the digital conversion of the difference between the maximum correct value $S106_{max}$ of the voltage signal S106 and the value of the voltage signal S107), the analog-to-digital converter 101 operates correctly, otherwise there is a failure in the analog-to-digital converter 101.

The operation of the analog-to-digital converter 101 in the configuration phase of the test mode according to the third embodiment of the disclosure differs from the operation in the configuration phase of the test mode according to the first embodiment of the disclosure in that:

at time $t_0$ (see FIG. 3) the output terminal 63 carrying the third voltage analog value $V_y$ is connected to the second terminals of the sampling capacitors 21, 22, . . . 24, 25; times $t_1$ and $t_2$ have no equivalent in the third embodiment and are neglected;

at time $t_3$ the controller 50 generates the switching signal S2, which opens the switches 35 and 36;

from t3 to t4 it occurs the switching of the sampling capacitors 21,22 . . . 24,25 to the configuration related to the third voltage analog value $V_y$ generated by the resistive-type digital-to-analog converter 60.

In the third embodiment any value of the third voltage analog value $V_y$ has a correspondent correct value that is the result of the conversion of the third voltage analog value $V_y$ in the condition of no failure inside the analog-to-digital converter 101 and ideal components composing the analog-to-digital converter 101, according to the known operation of a successive-approximation algorithm. This result is a binary value corresponding to a configuration of the third generator 120 wherein (for example) bit '1' is associated to one of the sampling capacitors 21,22 . . . 24,25 connected to the high reference voltage VrefH and bit '0' is associated to one of the sampling capacitors 21,22 . . . 24,25 connected to the low reference voltage VrefL, with the weight of each bit in the binary word result corresponding to the weight of the related capacitor inside the third generator 120.

From time $t_3$ to $t_4$ the controller 50 applies the correct result to the third generator 120.

At time $t_5$ the difference between the voltage signal S106 and the voltage signal S107 is evaluated on the plurality of reference capacitors 41, 42, . . . 44, 45. In the ideal case the change of the voltage signal S106 with respect to the voltage signal S107 is negligible. In the real case the change of the voltage signal S106 with respect to the voltage signal S107 is not negligible and depends only on the tolerance of the sampling capacitors 21,22 . . . 24,25 and on the tolerance of the resistors 61, 62, 64, 65, and the difference between the voltage signal S106 and the voltage signal S107 is evaluated with the successive-approximation algorithm carried out on the plurality of reference capacitors 41, 42, . . . 44, 45. In the real case if there are no failures or degradations of the components of the analog-to-digital converter 101, the tolerance affecting the components causes a shift of the voltage signal S106 with respect to the voltage signal S107 that is not negligible, but which is known in case the tolerance of the components is known: this known tolerance leads to a maximum $S106_{max}$ and minimum $S106_{min}$ correct values for the voltage signal S106 (like in the first embodiment of the disclosure, even if the two values $S106_{max}$ and $S106_{min}$ are different from $S6_{max}$ and $S6_{min}$ due to different components—the resistors 61, 62, 64, 65—involved in the third embodiment and the different related tolerance) and the difference between the voltage signal S106 and the voltage signal S107, which is evaluated with the successive-approximation algorithm carried out on the plurality of reference capacitors 41, 42, . . . 44, 45, is inside the range of correct values comprised between $S_{N,min}$" and $S_{N,max}$". On the contrary in the real case if there is a failure or degradation of a component of the analog-to-digital converter 101, the difference between the voltage signal S106 and the voltage signal S107, which is evaluated with the successive-approximation algorithm carried out on the plurality of reference capacitors 41, 42, . . . 44, 45, is outside the range of correct values comprised between $S_{N,min}$" and $S_{N,max}$".

The third embodiment of the disclosure has the advantage that the range used for checking in the test mode the correct operation of the analog-to-digital converter 101 is always the same as the third voltage analog value $V_y$ generated by the digital-to-analog converter 60 at the output terminal 63 changes.

Steps b, d, g, and h of the method can be performed by a software program running on a microprocessor (the controller 50), which can be a separate microprocessor or can be a microprocessor inside a specific or programmable integrated circuit (for example, a FPGA=Field Programmable Gate Array). The programming language used for the program software could be, for example, C or VHDL (Very high-speed integrated circuit Hardware Description Language) or Verilog.

The various embodiments described above can be combined to provide further embodiments. All of the U.S. patents, U.S. patent application publications, U.S. patent application, foreign patents, foreign patent application and non-patent publications referred to in this specification and/or listed in the Application Data Sheet are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An analog-to-digital converter, comprising:
a first generator configured to generate a first analog value according to a configuration signal when the analog-to-digital converter is operating in a first phase of a test mode;
a digital-to-analog converter adapted to generate a second analog value according to a control signal when the analog-to-digital converter is operating in a second phase of the test mode;
a second generator configured to generate a digital value from a comparison of the first analog value with respect to the second analog value according to a successive-approximation algorithm when the analog-to-digital converter is operating in the second phase of the test mode;
a controller adapted to receive a signal indicating the test mode, and adapted to:
generate in the first phase the configuration signal;
receive in the second phase the digital value and generate therefrom the control signal to control the generation of the second analog value according to the successive-approximation algorithm; and
generate, from the digital value, an alarm signal indicating a failure within the analog-to-digital converter or indicating a degradation of the performance of the analog-to-digital converter.

2. The analog-to-digital converter according to claim 1 wherein the digital-to-analog converter is a capacitive digital-to-analog converter that includes:
a second plurality of capacitors having a respective terminal connected to a second common terminal;
a second plurality of switches connecting a respective other terminal of the second plurality of capacitors to a low reference voltage or to an high reference voltage; and
wherein the controller is further adapted to generate the control signal for the configuration of the second plurality of switches in order to generate the second analog value on the second common terminal.

3. The analog-to-digital converter according to claim 1 wherein the first generator is a capacitive digital-to-analog converter that comprises:
a first plurality of capacitors having a respective terminal connected to a first common terminal; and
a first plurality of switches connecting a respective other terminal of the first plurality of capacitors to a low reference voltage or to an high reference voltage;
wherein the controller is adapted to generate the configuration signal for the configuration of at least part of the first plurality of switches in order to generate the first analog value on the first common terminal.

4. The analog-to-digital converter according to claim 3 wherein the controller is adapted to generate the configuration signal including a sequence of values for the configuration, when the analog-to-digital converter is operating in the first phase, of two switches out of the first plurality of switches, in order to generate a voltage of the first analog value on the first common terminal.

5. The analog-to-digital converter according to claim 4 wherein the sequence of values is configured to perform an inversion of the voltage of the other terminal of a capacitor connected to one of the two switches from a first reference voltage to a second reference voltage and to perform at substantially the same time an inversion of the voltage of the other terminal of another capacitor connected to the other one of the two switches from the second reference voltage to the first reference voltage, or vice versa.

6. The analog-to-digital converter according to claim 3 wherein the first generator includes a resistive digital-to-analog converter adapted to generate in the first phase a third analog value selected out of a plurality of analog values according to the configuration signal, wherein the first generator is further adapted to receive in the first phase the third analog value and to sample the third analog value over the first plurality of capacitors, wherein the controller is further adapted to receive in the second phase the digital value and to generate therefrom the control signal for controlling the generation of the second analog value according to a successive-approximation algorithm over the second plurality of capacitors.

7. The analog-to-digital converter according to claim 3 wherein the first generator includes a resistive digital-to-analog converter adapted to generate in the first phase a third analog value selected out of a plurality of analog values according to the configuration signal, wherein the first generator is further adapted to receive in the first phase the third analog value and to sample the third analog value over the first plurality of capacitors, wherein the controller is further adapted to generate the control signal for connecting the second plurality of capacitors to a fixed configuration, such that the digital-to-analog converter is adapted to generate a second fixed analog value, and wherein the controller is further adapted to receive in the second phase the digital value and to generate therefrom the configuration signal for controlling the generation of the first analog value according to a successive-approximation algorithm over the first plurality of capacitors.

8. The analog-to-digital converter according to claim 1 wherein the second generator includes:
a comparator adapted to receive the first analog value and the second analog value, to perform the comparison between the first analog value and the second analog value, and to generate therefrom the value of the bits of the digital value; and
a register adapted to store the digital value.

9. A method for testing the operation of an analog-to-digital converter, the method comprising: a first phase and a second phase, the first phase including:
   a) receiving a signal indicating a test mode operation;
   b) generating a configuration signal;
   c) generating a first analog value according to the configuration signal;
   the second phase including:
   d) generating a control signal;
   e) generating a second analog value according to the control signal;
   f) comparing the first analog value with respect to the second analog value and generating therefrom a digital value according to a successive-approximation algorithm;
   g) receiving the digital value and generating therefrom the control signal for controlling the generation of the second analog value according to the successive-approximation algorithm; and
   h) generating, from the digital value, an alarm signal indicating a failure within the analog-to-digital converter or indicating a degradation of the performance of the analog-to-digital converter.

10. The method according to claim 9 wherein the generating from the digital value an alarm signal includes:
   comparing the digital value with respect to a range of values; and
   generating therefrom the alarm signal indicating the failure or the degradation of the performance, in case the digital value is out of the range.

11. An integrated circuit comprising:
   an analog-to-digital converter that includes:
   a first generator configured to generate a first analog value according to a configuration signal when the analog-to-digital converter is operating in a first phase of a test mode;
   a digital-to-analog converter adapted to generate a second analog value according to a control signal when the analog-to-digital converter is operating in a second phase of the test mode;
   a second generator that configured to generate a digital value from the comparison of the first analog value with respect to the second analog value according to a successive-approximation algorithm when the analog-to-digital converter is operating in the second phase of the test mode; and
   a controller adapted to receive a signal indicating the test mode, and adapted to:
      generate in the first phase the configuration signal;
      receive in the second phase the digital value and generate therefrom the control signal for controlling the generation of the second analog value according to the successive-approximation algorithm; and
      generate, from the digital value, an alarm signal indicating a failure within the analog-to-digital converter or indicating a degradation of the performance of the analog-to-digital converter.

12. The circuit of claim 11 wherein the digital-to-analog converter is a capacitive digital-to-analog converter that includes:
   a second plurality of capacitors having a respective terminal connected to a second common terminal;
   a second plurality of switches connecting a respective other terminal of the second plurality of capacitors to a low reference voltage or to an high reference voltage; and
   wherein the controller is further adapted to generate the control signal for the configuration of the second plurality of switches in order to generate the second analog value on the second common terminal.

13. The circuit of claim 11 wherein the first generator is a capacitive digital-to-analog converter that comprises:
   a first plurality of capacitors having a respective terminal connected to a first common terminal;
   a first plurality of switches connecting a respective other terminal of the first plurality of capacitors to a low reference voltage or to an high reference voltage; and
   wherein the controller is adapted to generate the configuration signal for the configuration of at least part of the first plurality of switches in order to generate the first analog value on the first common terminal.

14. The circuit of claim 13 wherein the controller is adapted to generate the configuration signal including a sequence of values for the configuration, when the analog-to-digital converter is operating in the first phase, of two switches out of the first plurality of switches, in order to generate a voltage of the first analog value on the first common terminal.

15. The circuit of claim 14 wherein the sequence of values is configured to perform an inversion of the voltage of the other terminal of a capacitor connected to one of the two switches from a first reference voltage to a second reference voltage and to perform at substantially the same time the inversion of the voltage of the other terminal of another capacitor connected to the other one of the two switches from the second reference voltage to the first reference voltage, or vice versa.

16. An electronic system comprising:
   an analog-to-digital converter that includes:
   a first generator configured to generate a first analog value according to a configuration signal when the analog-to-digital converter is operating in a first phase of a test mode;
   a digital-to-analog converter adapted to generate a second analog value according to a control signal when the analog-to-digital converter is operating in a second phase of the test mode;
   a second generator configured to generate a digital value from the comparison of the first analog value with respect to the second analog value according to a successive-approximation algorithm when the analog-to-digital converter is operating in the second phase of the test mode; and
   a controller adapted to receive a signal indicating the test mode, and adapted to:
      generate in the first phase the configuration signal;
      receive in the second phase the digital value and generate therefrom the control signal for controlling the generation of the second analog value according to the successive-approximation algorithm; and
      generate, from the digital value, an alarm signal indicating a failure within the analog-to-digital converter or indicating a degradation of the performance of the analog-to-digital converter; and
   a micro-processor adapted to compare the digital value with respect to a range of values and to generate therefrom the alarm signal indicating the failure or the degradation, in case the digital value is out of the range.

17. The system of claim 16 wherein the digital-to-analog converter is a capacitive digital-to-analog converter that includes:
   a second plurality of capacitors having a respective terminal connected to a second common terminal; and a second plurality of switches connecting a respective other terminal of the second plurality of capacitors to a low reference voltage or to an high reference voltage, wherein:

the controller is further adapted to generate the control signal for the configuration of the second plurality of switches in order to generate the second analog value on the second common terminal;

the first generator is a capacitive digital-to-analog converter that includes:

a first plurality of capacitors having a respective terminal connected to a first common terminal; and a first plurality of switches connecting a respective other terminal of the first plurality of capacitors to a low reference voltage or to an high reference voltage; and the controller is adapted to generate the configuration signal for the configuration of at least part of the first plurality of switches in order to generate the first analog value on the first common terminal.

18. The system of claim 17 wherein the controller is adapted to generate the configuration signal, including a sequence of values for the configuration, when the analog-to-digital converter is operating in the first phase, of two switches out of the first plurality of switches, in order to generate a voltage of the first analog value on the first common terminal.

19. The system of claim 18 wherein the sequence of values is configured to perform an inversion of the voltage of the other terminal of a capacitor connected to one of the two switches from a first reference voltage to a second reference voltage and to perform at substantially the same time the inversion of the voltage of the other terminal of another capacitor connected to the other one of the two switches from the second reference voltage to the first reference voltage, or vice versa.

20. The system of claim 17 wherein the first generator includes a resistive digital-to-analog converter adapted to generate in the first phase a third analog value selected out of a plurality of analog values according to the configuration signal, wherein the first generator is further adapted to receive in the first phase the third analog value and to sample the third analog value over the first plurality of capacitors, wherein the controller is further adapted to receive in the second phase the digital value and to generate therefrom the control signal for controlling the generation of the second analog value according to a successive-approximation algorithm over the second plurality of capacitors.

* * * * *